United States Patent
Birkedal et al.

(10) Patent No.: US 7,693,203 B2
(45) Date of Patent: Apr. 6, 2010

(54) SINGLE-MODE PHOTONIC-CRYSTAL VCSELS

(75) Inventors: Dan Birkedal, Værløse (DK); Svend Bischoff, Fredensborg (DK); Michael Juhl, Frederiksberg (DK); Magnus Hald Madsen, Copenhagen N (DK); Francis Pascal Romstad, Copenhagen Ø (DK)

(73) Assignee: Alight Photonics APS, Farum (DK)

( * ) Notice: Subject to any disclaimer, the term of this patent is extended or adjusted under 35 U.S.C. 154(b) by 208 days.

(21) Appl. No.: 11/720,275

(22) PCT Filed: Nov. 29, 2005

(86) PCT No.: PCT/DK2005/000759

§ 371 (c)(1),
(2), (4) Date: Aug. 20, 2007

(87) PCT Pub. No.: WO2006/056208

PCT Pub. Date: Jun. 1, 2006

(65) Prior Publication Data

US 2008/0219307 A1      Sep. 11, 2008

Related U.S. Application Data

(60) Provisional application No. 60/631,210, filed on Nov. 29, 2004.

(51) Int. Cl.
*H01S 5/00* (2006.01)

(52) U.S. Cl. .................. 372/50.124; 372/43.01

(58) Field of Classification Search ........... 372/50.124, 372/43.01
See application file for complete search history.

(56) References Cited

U.S. PATENT DOCUMENTS

| 5,301,201 A | * | 4/1994 | Dutta et al. ............ 372/43.01 |
| 5,432,812 A | | 7/1995 | Kurobe et al. |
| 5,838,715 A | | 11/1998 | Corzine et al. |

(Continued)

FOREIGN PATENT DOCUMENTS

WO        WO 02/073753 A2      9/2002

OTHER PUBLICATIONS

C.W. Tee et al., "Design of Antiresonant-Reflecting Optical Waveguide-Type Vertical-Cavity Surface-Emitting Lasers Using Transfer Matrix Method", IEEE Photonics Technology Letters, vol. 15, No. 9, Sep. 2003, pp. 1231-1233.

(Continued)

*Primary Examiner*—Armando Rodriguez
*Assistant Examiner*—Phillip Nguyen
(74) *Attorney, Agent, or Firm*—Stephen A. Bent; Foley & Lardner LLP

(57) ABSTRACT

This specification discloses a VCSEL (Vertical-Cavity Surface-Emitting Laser) device with single-mode output and optionally single polarization output. This device is given by lateral mode confinement by the PBG (Photonic Band-Gap) effect by shallow etching in a partial VCSEL top mirror. The PBG area encircles a MS-region (Mode-Shaping region), which is characterized by large longitudinal mode losses. The MS-region encircles the LA-region (Light Aperture region), which is characterised by low longitudinal mode losses. The MS-region does not contribute to the lateral mode-confinement to the LA-aperture, and the lateral modes confined by the PBG area. The VCSEL is thus optimized for single fundamental mode operation.

25 Claims, 10 Drawing Sheets

U.S. PATENT DOCUMENTS

| | | | |
|---|---|---|---|
| 5,955,749 | A * | 9/1999 | Joannopoulos et al. ......... 257/98 |
| 6,185,241 | B1 | 2/2001 | Sun |
| 6,396,865 | B1 | 5/2002 | Mawst et al. |
| 6,542,527 | B1 * | 4/2003 | Gopinath ................. 372/45.01 |
| 6,704,343 | B2 * | 3/2004 | Deng et al. ................... 372/97 |
| 6,778,581 | B1 * | 8/2004 | Lipson ......................... 372/96 |
| 6,810,056 | B1 * | 10/2004 | Lipson et al. ............ 372/46.01 |
| 6,901,099 | B1 * | 5/2005 | Wasserbauer ............ 372/46.01 |
| 6,931,187 | B2 * | 8/2005 | Kim et al. ................... 385/124 |
| 2002/0163947 | A1 * | 11/2002 | Ostergaard et al. ............ 372/43 |
| 2004/0013157 | A1 * | 1/2004 | Deng et al. ................... 372/97 |
| 2004/0091010 | A1 * | 5/2004 | Choquette et al. ............. 372/44 |
| 2004/0114893 | A1 * | 6/2004 | Kim et al. .................. 385/123 |

OTHER PUBLICATIONS

N.S. Chen et al., "Suppression of Polarization Switching in Birefringent Antiresonant Reflecting Optical Waveguide Vertical-Cavity Surface-Emitting Lasers", IEEE Photonics Technology Letters, vol. 16, No. 3, Mar. 2004, pp. 711-713.

Delai Zhou, "High-Power Single-Mode Antiresonant Reflecting Optical Waveguide-Type Vertical-Cavity Surface-Emitting Lasers", Journal of Quantum Electronics vol. 38, No. 12, Dec. 2002, pp. 1599-1606.

F. Romstad et al., "True photonic band-gap mode-control in VCSEL structures", Abstract, 2003.

H.J. Unold et al., "Photonic Crystal Surface-Emitting Lasers: Tailoring Waveguiding for Single-Mode Emission", Proc 27th Eur Conf. on Opt. Comm. (ECOC'01 Amsterdam) pp. 520-521.

G. Ronald Hadley, "Effective index model for vertical-cavity surface-emitting lasers", Optics Letters, Jul. 1, 1995, vol. 20, No. 13, pp. 1483-1485.

D. Zhou et al., "Simplified-antiresonant reflecting optical waveguide-type vertical-cavity surface-emitting lasers", Applied Physics Letters vol. 76, No. 13, Mar. 27, 2000.

W.D. Zhou et al., "Electrically injected single-defect photonic bandgap surface-emitting laser at room temperature", Electronics Letters, Aug. 31, 2000, vol. 36, No. 18, pp. 1541-1542.

Byueng-Su Yoo et al., "Transverse Mode Characteristics of Vertical-Cavity Surface-Emitting Lasers Buried in Amorphous GaAs Antiguide Layer", IEEE Journal of Quantum Electronics, vol. 33, No. 10, Oct. 1997, pp. 1794-1800.

J.A. Cox et al., Guided mode grating resonant filters for VCSEL applications, SPIE vol. 3291, pp. 70-76 (1998).

* cited by examiner

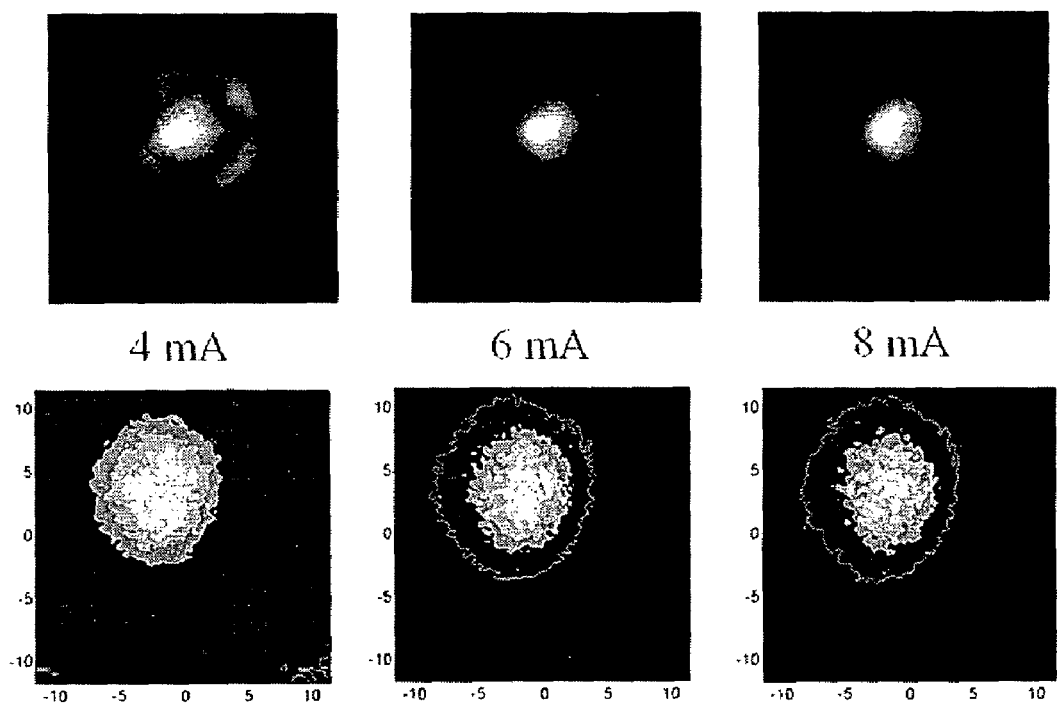
Fig. 10
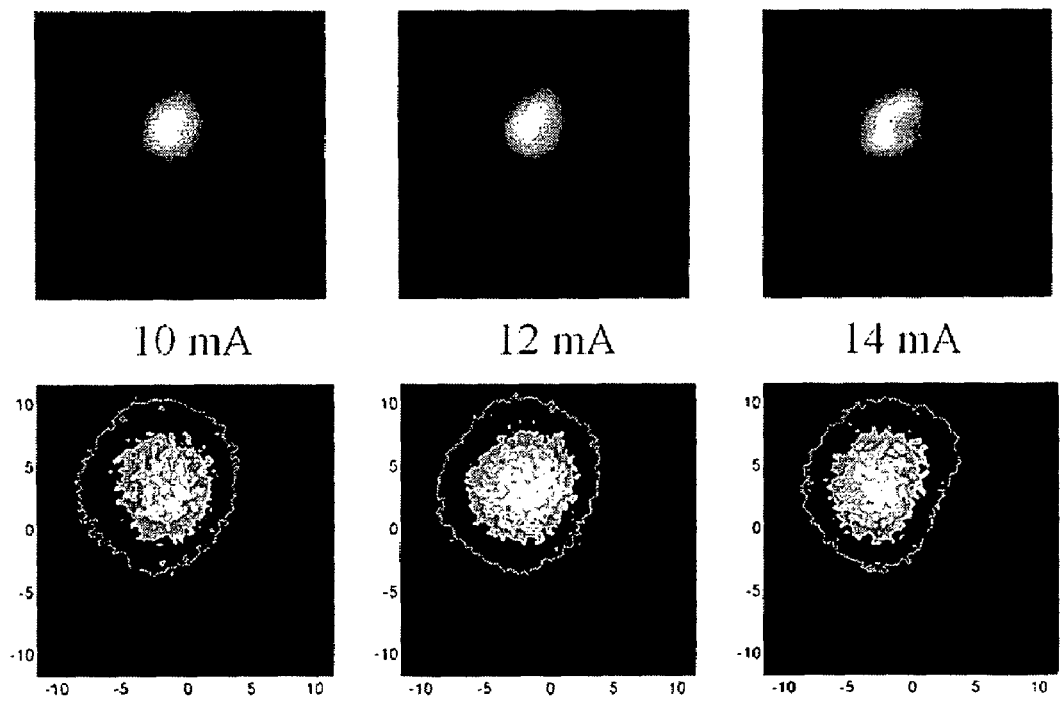

SINGLE-MODE PHOTONIC-CRYSTAL VCSELS

FIELD OF THE INVENTION

This invention pertains generally to the field of lateral mode-control in optical waveguides and particular to lateral mode-control in vertical-cavity surface-emitting lasers.

BACKGROUND OF THE INVENTION

Vertical-cavity surface-emitting lasers (VCSELs) have several advantages such as low-threshold, small size, on-wafer testability and high fiber coupling-efficiency. Single-mode VCSELs would be especially useful for applications such as data—(emission wavelength of $\lambda$=850 nm) and telecommunication ($\lambda$=1.3-1.7 μm), if sufficient high single-mode output powers (5-20 mW) could be extracted from a VCSEL.

VCSELs emit radiation perpendicular to the semiconductor substrate plane, either from the top or the bottom of the device structure. A VCSEL is a surface-emitting laser having mirrors disposed parallel to the substrate surfaces that form and enclose an optical cavity between them. VCSELs usually have a substrate upon which a first mirror stack and second mirror stack are disposed, with an active region between them comprising either quantum wells or quantum dots. Since the gain per pass in a VCSEL is much lower than in an edge-emitting laser a higher reflectivity of the mirrors is required. For this reason, the mirror stacks in a VCSEL typically comprise a plurality of Distributed Bragg Reflector (DBR) mirrors, which may have a reflectivity of 99% or higher. An electrical contact is usually positioned on the second mirror stack, and another contact is provided at the opposite end in contact with the substrate. When an electrical current is injected to flow between the two contacts, lasing is induced from the active region and emits through either the top or bottom surface of the VCSEL. A schematic drawing of a VCSEL structure is shown in FIG. 1.

FIG. 1 illustrates an example of a VCSEL 100 according to the prior art. The core of the VCSEL 100 is an active region 110 that includes quantum wells 112. In FIG. 1, the active region 110 is bound by the upper DBR layers 108 and lower DBR layers 114. One of the DBR layers includes n-type semiconductor material and the other p-type semiconductor materials. DBR layers are formed by alternating layers of material whose refractive index varies. Each individual DBR layer typically has a thickness of approximately $\lambda/4$. These alternating layers are often formed from semiconductor materials or dielectric materials.

Light is reflected at the junction of the DBR layers, but in order to achieve the high reflectivity required by VCSELs, many layers must be formed or grown. Thus, the DBR layers 108 and 114 form mirror layers that reflect light through the active region 110. The light aperture of the VCSEL 100 through which light is emitted is typically formed by selective oxidation of one or some of the DBR layers (region 106) or ion implantation to form an aperture 107 through which light can escape and through which electrical current can flow. Finally, the VCSEL 100 also includes a substrate 116 and metal contacts 104 and 118.

The composition of the active region 110 is often related to the wavelengths that are generated by the VCSEL 100 and are typically formed from some combination of GaAs or AlGaAs. The present invention is not limited to these materials. For example GaNAs, InGaNAs, InGaAs, GaInNAs, InGaAsP, and InGaP are often used in quantum wells that emit wavelengths of 650, 780, 850, 980, 1300 and 1550 nm. The composition of the quantum well or the bulk active region has an impact on the band gap, which is related to the wavelengths or modes generated by the VCSEL 100.

The mode confinement in conventional optical waveguides is achieved by having a core with a high refractive index surrounded by a cladding with a lower refractive index. This results in a waveguide based on the principle of total internal reflection. In an optical resonator, such as a VCSEL, a cavity resonance-wavelength shift corresponds to an effective index step in a conventional optical waveguide structure, $\Delta\lambda/\lambda=\Delta n/n$, as pointed out by Hadley [G. R. Hadley, "Effective index model for vertical-cavity surface-emitting lasers," Optics Letters Vol. 20, No. 13, p 1483 (1995)]. As a result, lateral mode confinement in a VCSEL can be accomplished by having a core with a long cavity resonance-wavelength surrounded by a cladding region with a short cavity resonance-wavelength. The lateral mode confinement in such a VCSEL is analogous to the lateral mode-confinement in a conventional index-guided fiber.

In contrast, micro-structured fibers having a rich topology in the refractive index of the cladding, typically air-holes in a silica cladding, enable lateral mode-confinement to a central, low-index core of the fiber (for example a large air-hole). These fibers are denoted Photonic Band-Gap (PBG) fibers. The PBG fibers guide light by an effect that may be seen as an optical analogue to the electronic bandgaps of semiconductors. The light aperture of a PBG fiber, also denoted the PBG-defect, has an effective index which is lower than the surrounding cladding region. A fiber where the index of the core is lower than the cladding is denoted an anti-guide, and would not confine any lateral modes in the absence of the photonic bandgap effect.

Lateral mode-confinement by the PBG effect in a VCSEL can be implemented by a core (light aperture) surrounded by a cladding region with a rich topology with variations of the cavity resonance-wavelength. Etching in the top of a VCSEL DBR top-mirror results in a shift of the cavity resonance-wavelength. Local etching of a VCSEL top mirror is thus an efficient method to locally modify the cavity resonance wavelength and to implement lateral mode confinement by the PBG effect as described in the previous patent application WO 02/073753.

Let us for clarity give a more in-depth explanation of the relation of the index step in an optical fiber with the cavity resonance condition in an optical resonator like a VCSEL.

An optical resonator can be realized using two plane-parallel mirrors separated with a spacer of a thickness L and refractive index n. Without loss of generality we can assume that the plane mirrors extend in the xy-plane. An optical resonator is characterized with a set of resonance wavelengths $\lambda_m=2\ Ln/m$, m=1, 2, 3, . . . Light with these wavelengths will at normal incidence experience increased transmission through the resonator.

The laser cavity may support a plurality of lateral modes for the generated light. In the present application, a lateral electromagnetic mode can be regarded as a distribution of plane waves, with wave-vectors $\vec{k}$ describing the propagation of the electromagnetic field. Any of the wave-vectors $\vec{k}$ may be projected onto a plane which is normal to the extension of the cavity, such as a plane parallel to a mirror. The projection of $\vec{k}$ onto such a plane will be designated the lateral component $\vec{k}_\parallel$ of the wave-vector $\vec{k}$, the term lateral refer to the extent of the cavity rather than to $\vec{k}$. The length of $\vec{k}$ is $$k = \frac{2\pi\bar{n}}{\lambda},$$

where $\bar{n}$ is the effective longitudinal index of refraction. The lateral component of $\vec{k}$ is thus useful for defining a lateral-wavelength:

$$\lambda_\parallel = \frac{2\pi\bar{n}}{|k_\parallel|},$$

the propagation constant in the z-direction is accordingly $$k_z = \frac{2\pi\bar{n}}{\lambda_z},$$

where $k=\sqrt{|k_z|^2+|k_\parallel|^2}$.

Let us in a first example assume a VCSEL resonator where the core of the VCSEL has a short cavity resonance-wavelength $\lambda_{core}$, while the cladding region has a longer cavity resonance-wavelength $\lambda_{clad}$. The lengths of the resonant wave-vectors of the two regions are:

$$k_{z,core} = \frac{2\pi\bar{n}}{\lambda_{core}} > k_{z,clad} = \frac{2\pi\bar{n}}{\lambda_{clad}}.$$

We first consider an electromagnetic field resonant with the core resonator: $\lambda=\lambda_{core}$ and $$k = \frac{2\pi\bar{n}}{\lambda_{core}},$$

hence the field has a wave-vector $\vec{k}=\vec{k}_{z,core}$, and propagates solely in the direction of the z-axis in the core resonator. However, in the cladding resonator we find that since $\vec{k}$ is conserved, $\vec{k}=\vec{k}_{z,clad}+\vec{k}_{\parallel,clad}$, where $k_{\parallel,clad}^2=k^2-k_{z,clad}^2$ or $$k_{\parallel,clad}^2 = \left(\frac{2\pi\bar{n}}{\lambda_{core}}\right)^2 - \left(\frac{2\pi\bar{n}}{\lambda_{clad}}\right)^2.$$

Since $\lambda_{core}<\lambda_{clad}$ the value of $k_{\parallel,clad}$ is real and the field can freely propagate in the cladding region. In this case the core region is an anti-guide. Now in the opposite case $\lambda_{core}>\lambda_{clad}$ the value of $k_{\parallel,clad}$ would be complex corresponding to an evanescent field in the cladding region. In this case the core would be a guide for the optical field.

The discussed example shows how the cavity resonance wavelength determines the guide- or anti-guide properties of a VCSEL. Furthermore, the discussed example gives a good physical picture of what is meant by lateral-wavelength ($\lambda_\parallel$), which will be extensively used when discussing the implementation of lateral mode-confinement by the photonic band-gap effect in a VCSEL.

For PBG waveguides, the physical dimensions of the PBG micro/nano-structuring is related to the lateral wavelength ($\lambda_\parallel$) and is expected to be quite large since $\lambda_\parallel$ is expected to be much larger than longitudinal wavelength $\lambda_z$ as well as the free-space wavelength. The realization of the PBG effect is thus not expected to be limited by the present limits of semiconductor processing techniques.

The cavity resonance wavelength of a vertical-cavity surface-emitting laser can be changed by a variation of the thickness of one or several layers within the Bragg mirror of the VCSEL. A change in the cavity resonance wavelength can be observed as a periodic function of etch depth, when etching through a VCSEL mirror.

As described previously, the lateral mode confinement of a waveguide (VCSEL) depends on the index (cavity resonance wavelength) difference. Local etching of a VCSEL top mirror can be used to form a weak index guide or a weak anti-guide, if the cavity resonance wavelength is longer or shorter for the core part of the VCSEL compared to the cladding region, respectively. The reflectivity of the VCSEL top or bottom mirror is changed when the mirror is thinned down by etching. However, the reflectivity is not decreasing monotonically as a function of etch depth, but is, similarly to the cavity resonance wavelength, a periodic function of the etch depth. The periodicity is given by the longitudinal quarter wavelength within the Bragg mirror material. The maximum and minimum reflectivity of this periodic mirror reflectivity is of course decreasing for increasing etch depth as a result of the decreasing number of DBR mirror layer pairs.

FIG. 2 illustrates an example of a vertical cavity surface emitting laser 200 where a photonic micro/nano-structure 210 is added in the top of the DBR mirror layers 202, see e.g. WO 02/073753. The active region 204 is bound by the upper DBR layers 202 and lower DBR mirror layers 206. The photonic micro/nano-structure 210 is formed by shallow or deep etched holes 212 from the top of the upper DBR mirror for lateral mode control. The photonic micro/nano-structure defines a light aperture region 214 through which light is emitted. The lateral current confinement is typically formed by selective oxidation of one or more layers within the DBR structure or ion implantation. The current aperture is typically larger than the light aperture 214 of the photonic micro/nano-structure. The lateral light and current aperture are thus decoupled for this kind of VCSEL 200. The lateral optical modes are thus optimised independently of the electrical lateral current aperture.

The cavity resonance wavelength shift is relatively small when etching in a complete semiconductor top-mirror in case of shallow etches (just a few DBR mirror pairs). The cavity resonance wavelength is changed by several nanometers, when deep holes (penetrating several periods) are etched into one of the DBR mirrors of the VCSEL as in region 210 of FIG. 2. In this case the longitudinal reflectivity of the etched areas 212 is significantly reduced as a result of the reduced number of DBR mirror layer pairs. The reduced DBR reflectivity will, together with the achieved cavity resonance wavelength shifts, determine the lateral modes confined to the light aperture 214. In some cases, the laterally changing loss will dominate the mode confinement in a process similar to the gain-guiding mechanism well known from broad area edge emitting lasers. Furthermore, the implementation of the PBG effect requires a relatively high cavity resonance wavelength shift between etched and un-etched areas.

The actual value of the cavity resonance wavelength as function of etch depth is dependent on the position of etches within the DBR. A large shift of the cavity resonance wavelength is possible by shallow etching, when the PBG structures are close to the active region of the VCSEL and embedded in the DBR top mirror. The maximum cavity resonance wavelength-shift decreases (for the same etch depth), as the position of the PBG structures are closer to the top of the DBR mirror. Hence, to introduce the necessary high cavity resonance wavelength shift between etched and un-etched areas, shallow holes 312 are etched within one of the VCSEL DBRs as shown in FIG. 3 instead of on top of the DBR. The cavity resonance wavelength shifts are very large (several tens of nano-meters) for etch depths of less than 200 nm, and the mirror reflectivity (photon-lifetime of the VCSEL cavity) is much less affected by this approach.

FIG. 3 illustrates an example of a vertical cavity surface emitting laser 300 where a photonic micro/nano-structure 318 is embedded in the top DBR mirror layers 302, see e.g. WO 02/073753. The shallow etching of holes 312 is done in a partial top mirror, which reflectivity is insufficient for lasing of the VCSEL. The top DBR mirror reflectivity necessary for reaching lasing is for example obtained by a re-growth processing step or deposition of a dielectric top-mirror. The full DBR top mirror 302 consists of three different layers, the first un-etched partial top-mirror region 316. The lateral micro/nano-structuring 310 in the partial top-mirror layer 318 is made by shallow etching of holes. The top-mirror 320 is deposited or re-grown after definition of the lateral micro/nano-structuring 310.

The partial DBR top-mirror layer 316 may be omitted or replaced with a spacer layer. Furthermore, the micro/nano-structured layer 318 may be formed by shallow etching in either a partial semiconductor DBR top-mirror layer or a dielectric DBR top-mirror layer or a combination of both semiconductor and dielectric partial DBR top-mirror layers. The light-aperture region 314 defines the PBG-defect to which region the light is confined. The cavity resonance wavelength of the LA-region 314 is typically at least shorter or equal to the surrounding region 312 and 313. The cavity resonance wavelength depends on the etch depth and the difference in cavity resonance wavelengths of region 312, 313 and 314 has been visualized by different etch depths. Finally, the VCSEL 300 also includes an active region 304, a lower DBR bottom-mirror 306 and substrate 308.

The patent U.S. Pat. No. 6,396,865 by L. J. Mawst and D. Zhou discloses a vertical-cavity surface-emitting laser, where the lateral mode confinement is implemented with a single or two anti-resonant reflecting optical waveguide (ARROW) rings. The ring width is an odd number of lateral quarter wavelengths.

The ARROW method using only a single ring was also published in: D. Zhou and L. J. Mawst, "Simplified-antiresonant reflecting optical waveguide-type vertical surface-emitting lasers", Applied Physics Letters Vol. 76, No. 13, p. 1659 (2000). The ARROW method uses one or two anti-resonant reflecting rings to reduce the lateral wave-guiding losses resulting from the poor mode confinement of a central anti-guide. The anti-guide promotes single-mode operation, while the anti-resonant reflecting ring(s) reduce the lateral radiation losses for the fundamental mode and higher order modes. The threshold current of a VCSEL using only an anti-guide is thus reduced when implementing the ARROW mode confining ring(s). The lateral radiation losses for the higher order modes are also reduced in the ARROW design, but are still significantly higher than for the fundamental mode.

In "Suppression of Polarization Switching on Birefringent Antiresonant Reflecting Optical Waveguide Vertical-Cavity Surface-Emitting Lasers," IEEE Photonics Technology Letters, Vol. 16, No. 3, p. 711 (2004) by N. S. Chen, S. F. Yu, and C. W. Tee, the one and two anti-resonant ring VCSEL designs are shown to have improved single polarization mode stability, when the ring next to the anti-guide (light aperture) is slightly broader than an odd number of lateral quarter wavelengths. The ring width increases up to approximately $\lambda/3$ for optimum polarization stability, the ring is circular and does not introduce any asymmetry in the lateral reflection coefficients for the two orthogonal polarization states.

These prior single-mode designs are based on a method, where the anti-guide (light aperture) is enclosed by an area (ARROW ring(s)) giving an increased confinement to the anti-guide, which reduces the lateral radiation losses of both the fundamental and higher order modes. The addition of these rings result in a decreased threshold current compared to an anti-guide VCSEL structure due to the reduced radiation losses. However, lateral mode confinement by one or two reflector-rings decreases the single mode operating regime for larger light aperture (anti-guide) size, since both the fundamental and higher order lateral modes are more strongly confined for these ARROW type VCSEL designs.

The physical implementations of these prior single-mode designs have been using epitaxial re-growth to implement the arrow rings. This is a costly production method and it reduces the yield significantly in the processing of devices. The designs furthermore use ion-implantation to confine current in the lateral direction. This has the advantage of restricting flow of current without introducing optical confinement. However, the method has to a large degree been abandoned by the industry due to large process variations and instabilities. Instead, oxide confinement is dominating present implementations of VCSELs resulting in high yield and excellent reliability. The introduction of oxide confinement in the arrow type single mode VCSELs is difficult and not yet demonstrated. The presence of the oxide layer will disturb the function of the arrow rings due to the lateral confinement of the oxide aperture itself.

U.S. Pat. No. 6,185,241 discloses a microcavity laser in which an annular metal layer suppresses higher-order modes by introducing an absorbing aperture. A typical value for the diameter of the annular metal layer is 5 um, and besides introducing a mode-dependent loss, the annular metal layer also defines the aperture of the laser.

U.S. Pat. No. 5,838,715 discloses a VCSEL comprising a loss-determining element that progressively increases an optical loss of the VCSEL's optical cavity with increasing lateral distance from the optical axis (the axis parallel to the substrate normal). An annular metal layer provides a mode-dependent loss and also defines the light aperture of the laser. The loss-determining element is typically a curved section that provides a lens effect.

U.S. Pat. No. 5,432,812 discloses use of a micro-cavity semiconductor laser having a three-dimensional optical reflector that covers a double-heterostructure section for controlling the spontaneous emission along various directions and for increasing the coupling ratio of spontaneous emission with a specific laser mode to thereby decrease the threshold current of the laser. Embodiments of lasers according to the invention disclosed in U.S. Pat. No. 5,432,812 may have a PBG-structure similar to those illustrated by 210 in FIG. 2 or region 310 in FIG. 3. A laser according to U.S. Pat. No.

5,432,812 has an optical reflector covering its double heterostructure section, which is a section that surrounds the active portion of the laser.

SUMMARY OF THE INVENTION

It is an object of the invention to provide a technique for lateral mode control in VCSELs, capable of providing large-aperture single-mode high-power VCSELs.

The invention gives an improved VCSEL design by providing basic structural details allowing large-aperture single-mode high-power operation. Due to the complicated nature of the subject matter, a general description of features involved in this novel VCSEL design is given in the following. This serves to give an overview and to introduce terms and concepts of the invention and shall not be used to limit the scope or inventive step of the invention.

Lateral mode-control according to the present invention is implemented by combining confinement of the lateral modes with a mode-size dependent optical loss. The confinement/loss is obtained by modifying the longitudinal layer structure locally, typically by either deposition of a small amount of additional material or by shallow etchings in or within a partial top (bottom) mirror. The layouts of lateral regions in the following are, unless otherwise indicated, described as seen from the top of the VCSEL and along the optical axis (which is normal to the substrate). "Top" refers to that end of the VCSEL which is opposite the substrate end. Accordingly, to exemplify, layer 412 in FIG. 4 is the top-most part of VCSEL 424. Vertical directions are parallel to the optical axis; lateral directions are normal to the optical axis.

The lateral mode control is used to ensure single fundamental mode operation of the VCSEL. The lateral mode control is implemented by having three different lateral regions. The core is typically unstructured and denoted the (first) light aperture (LA), since the lasing lateral modes are mainly confined to this region. The longitudinal mirror reflectivity is optimised for the light aperture with respect to a high longitudinal reflection (meaning low longitudinal losses or long photon-lifetimes), which results in a long cavity photon lifetime, low threshold current and high output power.

The second region surrounding the LA is called the Mode-Shaping region (MS-region). The MS-region does not result in any lateral confinement of optical modes to the light aperture, since the MS-region preferably has a longer longitudinal cavity resonance wavelength than the longitudinal cavity resonance wavelength of the LA. The light aperture or core is thus an anti-guide structure and the lateral modes are leaking from the core into the MS-region. Since the reflectivity, as the cavity resonance wavelength, is a periodic function of the etch depth, the longer cavity resonance wavelength of the MS-region is chosen in such a way that the longitudinal reflectivity is lower and thereby has a shorter photon life-time than the light aperture. Hence lateral modes penetrating significantly into the MS-region will experience a large loss and consequently will have a high threshold current for lasing. The width of the MS-region is, in case of an annular shaped region, chosen to be a positive integer times a half-lateral-wavelength ($\lambda_\parallel$), which minimizes the lateral reflectivity from this region.

The introduction of the lateral quarter wavelength is done because of its analogy to a Bragg mirror. However, the lateral wavelength is a function of the radius in case of lateral mode confinement in a VCSEL, since the cold cavity eigenmodes are described by Bessel functions. The zeros of the Bessel functions thus determine the radial dimensions (lateral wavelength), as discussed by C. W. Tee, C. C. Tan and S. F. Yu "Design of antiresonant-reflecting optical waveguide-type vertical-cavity surface-emitting lasers using transfer matrix method", IEEE Photonics Technology Letters Vol. 15, No. 9, p. 1231 (2003). The notation of a lateral wavelength in our VCSEL design is thus not a fixed number but related to the Bessel function describing the cold cavity modes of the VCSEL. It is however convenient to refer to just the lateral wavelength with regard to the analogy with a Bragg mirror without discussing the relation to the Bessel functions. The lateral wavelength in our design guidelines is thus not a fixed number, but determined by the zeros of the Bessel function.

The presence of the MS-region does not result in lateral mode confinement to the LA. The combination of the LA with the MS-region results in a VCSEL structure with large lateral radiation losses.

The MS-region is again enclosed by a region with a micro/nano structuring having variations in the cavity resonance wavelengths with a period in the range of the lateral wavelength ($\lambda_\parallel$). The variations result in good lateral mode confinement to the LA and MS-regions. In other words, the MS-region is enclosed by a Mode-Confinement region (MC-region), which inhibits light propagation and thus results in confinement of the lateral modes to the LA and MS-regions.

Cavity resonance wavelengths of the MC-region are longer than, or at least equal to, the cavity resonance wavelength of the LA-region (remember that the cavity resonance wavelength is a periodic function of etching depth or growth/deposition height). Therefore, neither the MS-region nor the MC-region, in itself, provides lateral confinement since both regions have a longer cavity resonance wavelength than the core, hence, the structure is still anti-guiding with respect to the surrounding MC-region and MS-region. The periodic structuring of the MC-region provides the confinement.

The fundamental mode has typically a small overlap with the MS-region, while the higher order modes have a larger overlap with the MS-region. The shorter photon-lifetime of the MS-region thus results in a mode selective loss mechanism which ensures single fundamental mode operation of the VCSEL. (Furthermore, the MC-region may be designed in such a way that only the fundamental mode is well confined while higher order lateral modes are very weakly bound and may penetrate relatively deep into both the MS and also the MC-region, which further improves the lateral mode selectivity of the proposed VCSEL.

The above description served to give a general, conceptual overview of the invention. In the following, a more detailed description of aspects and preferred implementations of the invention will be presented.

In general, VCSELs involve a multi-layer structure. In the following, different regions are defined in one or more layers, and this affects the behaviour of the modes throughout the structure. As a region in one layer affect the behaviour in another layer, such region may be thought of as defining a column through all layers of the structure although it is only physically present in one or some layers. Therefore, the relative size, shape and position of the different regions, hereafter referred to as the relations between the regions, are determined in a projection along a direction normal to the layers, i.e. as seen from a top view.

In a first aspect the present invention provides a VCSEL comprising:
   a semiconductor material layer having an active region for generating light and for emitting the generated light,
   first and second at least substantially parallel mirrors forming a laser cavity comprising the active region, the laser cavity and the active region supporting at least one longitudinal electromagnetic mode for the generated light, a central light aperture (LA) region providing a long photon lifetime and overlapping with or at least partly encircling the active region, a mode-shaping (MS) region formed within or adjacent to the first and/or the second mirror and encircling the LA-region, the MS-region providing a shorter photon lifetime than the LA-region, a mode confinement (MC) region formed within or adjacent to the first and/or the second mirror and encircling the MS-region, and designed to provide lateral confinement of modes to the MS-region and the LA-region, wherein dimensions of the LA-region, the MS-region and the MC-region are selected to engineer an efficiency of laser action in each transverse electromagnetic mode of the cavity.

In an alternative formulation, the first aspect provides a VCSEL comprising an active region, first and second at least substantially parallel mirrors forming a laser cavity comprising the active region, a light aperture (LA) region providing a long photon lifetime, a mode shaping (MS) region;

a mode confinement (MC) region formed adjacent to or within the first and/or second mirror and designed to provide lateral confinement of modes to the MS-region and the LA-region wherein the mode shaping (MS) region is formed between the LA-region and the MC-region, the MS-region being formed adjacent to or within the first and/or second mirror and providing a shorter photon lifetime than the LA-region.

To further illustrate the applied terminology, the term "the MS-region encircling the LA-region" does not require that the MS-region and the LA-region are defined in the same layer, merely that the projection of the MS-region encircles the projection of the LA-region, or, in another formulation, the column through all layers defined by the MS-region in a first layer encircles the column through all layers defined by the LA-region in a second layer.

Moreover, the term encircle is interpreted as forming a closed loop around, without regard to the shape of the loop. In some instances, e.g. an outer region encircles an inner region as a matter of definition since the start of the outer region automatically means the end of the inner region. Although physical effects of the inner regions may still be present in the outer region, the presence of other physical effects belonging to the outer region defines the naming of the region. Therefore, one might take the approach that the regions are instead overlapping, but this approach is not adopted in the present context and should not be relied upon in limiting the scope of the invention.

Also, within the present context, a ring is not circular but may be any closed-loop structure such as a circular structure. Where a ring is defined in a given layer, the width of the ring is the dimension of the ring in a substantially radial direction whereas the thickness of the ring is the thickness of the layer. Also, an aperture is a through opening of any shape.

By engineering an efficiency of laser action in each transverse electromagnetic mode of the cavity is meant to plan, design or create a predetermined efficiency, that may be a low, intermediate or high efficiency or just an approximate efficiency as desired by the designer.

Preferably the LA region and the MS region are not formed in contact with the active region. It is also preferred that the LA region and the MS region are not formed in layers adjacent to the active region. This is in contrast to lasers according to U.S. Pat. No. 5,432,812, which have a reflector section which is in contact with the active region in order to increase the coupling between spontaneous emission and the gain layer.

Lasers in accordance with the first aspect of the present invention are also fundamentally different from lasers according to U.S. Pat. No. 6,185,241. In lasers according to U.S. Pat. No. 6,185,241, the lateral modes are mainly controlled by an annular metal layer that also serves as light aperture.

The mode-shaping mechanisms in the first aspect of the present invention are also fundamentally different from those disclosed in U.S. Pat. No. 5,838,715. In U.S. Pat. No. 5,838,715, a loss-determining element progressively increases the optical loss of the VCSEL cavity with increasing lateral distance from the optical axis, the loss-determining element being a curved section that acts as a lens. Furthermore, an annular metal layer provides a mode-dependent loss and also defines the light aperture.

In lasers according the first aspect of the present invention, the LA region and the MS region are preferably both separated from the active region, typically by several intermediate layers. Preferably, embodiments of the first aspect have their LA region and MS region near the top of the VCSEL, separated from the active region by a part of the top mirror, such as by one or more quarter-wavelength DBR layers.

In a second aspect the present invention provides a method for engineering an efficiency of laser action in transverse electromagnetic modes of a vertical cavity surface emitting laser (VCSEL), the method comprising the steps of providing a VCSEL comprising an active region, first and second at least substantially parallel mirrors forming a laser cavity comprising the active region, and a central light aperture (LA) region providing a long photon lifetime, introducing losses to modes depending upon their lateral profile by forming a mode-shaping (MS) region around the LA-region making the LA-region anti-guiding with respect to the MS-region, the MS-region providing a shorter photon lifetime than the LA-region, and laterally confining modes to the MS-region and the LA-region by forming a mode confinement (MC) region around the MS-region.

It is an advantage of the present invention, that it suppresses or prevents laser action in modes by providing regions into which transverse components of the radiation can (MS-region) and cannot (MC-region) propagate. Therefore, there will be little or no laser action in modes extending substantially into the MS-region and/or MC-region. Hence, the invention suppresses multimode lasing by introducing severe losses for modes penetrating into the MS-region, while the MC-region does not allow any penetration of the field.

Taking another point of view, the lateral modes are restricted in size by the MC-region, whereby their overlap with the MS-region determines the mode losses. The fundamental mode is significantly narrower than the higher order modes—hence, lasing in the fundamental mode is promoted compared to lasing of lateral higher order modes.

The MS-region serves to introduce losses for modes having significant overlap with the MS-region. Hence, modes supported by the cavity should preferably extend into the MS-region. This may be ensured by making the LA-region an anti-guide with respect to the MS-region, and by designing the MS-region to reduce/minimise lateral confinement of modes to the LA-region. If the MS-region has a periodic structure, it should not provide a reflection of lateral wavelengths at a boundary between the MS-region and the LA-region. On the other hand, leaking of modes from the LA-region to the MS region should be ensured.

Forming the MS and MC-regions adjacent to the first and/or the second mirror may be implemented by forming these within a spacer layer positioned between the gain region and the first and/or the second mirror. A spacer layer may be positioned between the gain region and only one of the mirrors. Alternatively, one spacer layer may be positioned between the gain region and the first mirror, while another spacer layer is positioned between the gain region and the second mirror. Alternatively, two or more spacer layers (e.g. manufactured from various materials) may be positioned between the gain region and the first and/or the second mirror, or one or more of the spacer layers may be constituted by a number of layers, e.g. of various material.

Although the light aperture region may only be physically defined in few layers in the structure, the projection of the light aperture region through the structure in a direction perpendicular to the mirrors defines a region also denoted the core.

By positioning the MS and MC-regions within or adjacent to the first and/or the second mirror, or within one of the spacer layer(s), it is ensured that the MS and MC-regions do not extend through the whole of the gain region. Preferably, the MS and MC-region is positioned so that they do not intersect the gain region at all. This is of great advantage since this ensures that the full gain region is available for providing sufficient output power from the VCSEL. Preferably the LA region and the MS region are not in contact with the gain region, or formed in layers adjacent to the gain region.

In preferred embodiments, the LA-region, the MS-region and the MC-region are formed in a partial semiconductor DBR top mirror. Alternatively, the LA-region, the MS-region and the MC-region are implemented in dielectric top-mirror layers. Any combination of these are also possible, e.g. the MS defined in a dielectric top-mirror and the MS region defined in a semiconductor DBR bottom mirror etc. The various regions and structures are typically implemented by etching different parts of one or more layers to different depths. This process is therefore generally referred to as vertical structuring. The etched layer may be subject to regrowth.

Where the MS-region is an unstructured region, it is typically formed by a ring of material having diverging, optical characteristics compared to adjacent material in a plane containing the ring. In this case, the width of the ring should be an even number of lateral-quarter-wavelengths or ranges around these as dictated by the Bessel functions, e.g. increased or decreased by a 0-5% or 0-10% or 0-15% or 0-20% or 0-25% or 0-30%. Equivalently, the width of the ring may be an odd number of lateral-half-wavelengths increased or decreased by 0 to 30%. Where the MS-region of a micro/nanostructured region typically is formed by structures minimising the lateral reflection of this region with respect to the LA-region.

The MC-region may e.g. be implemented by a one-dimensional radial PBG structure, in which case the MC-region consists of several rings of alternating long and short cavity resonance wavelengths, as sketched by region 504 in FIG. 5. The longitudinal cavity resonance wavelength of each ring is alternating between a long and short value to ensure the PBG effect in the radial direction. These rings result in a strong lateral confinement, similar to the longitudinal confinement of the high longitudinal reflectivity of the DBR-mirror layer pairs. Alternatively the MC-region could consist of one or more rings, in which case the confinement mechanism may be weak resulting in penetration of the fundamental and higher order modes into the MC-region. The width of the rings in the MC-region is then preferably adjusted to have a width of an odd number of lateral-quarter-wavelengths ($\lambda_l/4$), increased or decreased by a 0-5% or 0-10% or 0-15% or 0-20% or 0-25% or 0-30% in width according to the appropriate Bessel functions.

Alternatively, the rich topology of the MC-region may be implemented by a two- or three-dimensional PBG-structure which gives a strong lateral mode-confinement to the LA and the MS-regions. The two-dimensional PBG effect can for example be implemented by a periodic arrangement of rods with a long or short cavity resonance wavelength compared to the intermediate area between the rods, please refer to region 604 in FIG. 6 for an example. The periodic arrangement of the two-dimensional PBG structure may be e.g. a tri-diagonal, Honey-comb or square lattice arrangement of circles, rect-angles, tri-angles or combinations hereof.

Photonic band gap effects are well documented both experimentally and theoretically. They rely on a periodic modulation of an optical constant such as the material permittivity in one, two, or three dimensions by forming a one, two, or three-dimensional periodic micro/nano-structure. The micro/nano-structure by shallow etching in a VCSEL top (or bottom) mirror results in a modulated refractive index (etching of air holes) as well as in a modulation of the photon lifetime.

The MS-region may be formed by a ring-shaped region having an etch depth providing a lower reflectivity and thereby shorter photon life-time. Preferably, to counteract lateral confinement, such ring or rings have a width being an even number of lateral-quarter-wavelengths as defined by the Bessel functions. Alternatively, if the MS-region is micro- or nanostructured, the structuring is designed to minimise the lateral reflection of this region with respect to the LA-region.

In a preferred embodiment, the MC-region is shaped to promote polarisation control of the emitted light. Here, the MS-region may be an elliptical ring wherein the width of the elliptical ring along the large and small axes is an even number of lateral-quarter-wavelengths or an odd number of lateral-half-wavelengths, again the width may have to be increased or decreased by 0 to 30% as dictated by the appropriate Bessel functions. Also, for the MC-region, the one-dimensional PBG structure may be implemented by one or more elliptical rings where the width of the elliptical rings for the large and small axes is an odd number of lateral-quarter-wavelengths increased or decreased by 0 to 30%. Any other elongated shape of the MC- and/or MS-regions could be used to provide the polarisation control. In another embodiment, the shape of the rings forming the MS- and/or MS-regions need not to be elliptical, but could be another elongated shape such as rectangular, oval or another non-centre-symmetric. Similarly, in the case of two-dimensional PBG structure, the periodicity or dimensions of the micro/nano-structured region is modified in selected regions to obtain the non-centre-symmetry providing polarisation control.

If the VCSEL is electrically driven, it may further comprise current supply means for supplying an electric current to a region of the semiconductor material for defining the gain region. Alternatively, if the VCSEL is optically pumped, it may comprise means for supplying optical pumping to a region defining the gain region. In both cases, the gain region may be characterised in that it, in a second plane at least substantially parallel to the first and second mirror, has a substantial overlap with one or more transverse electromagnetic modes of the cavity.

Thus, the separation of the current confinement and the lateral mode-control allows a much larger gain region while having mode-control, such as while having single mode operation. Since the lateral mode-control is provided by the MC-region and MS-region and the light aperture, the gain region may energetically couple to several transverse modes without deterioration of the single mode operation.

If the current confinement results from an oxide-aperture, the small effective guide resulting from the oxide layer can be nullified by letting the oxide boundary overlap with the MS-region or the MC-region. Preferably, the oxide boundary is laterally positioned within the MS-region, since in this case the fundamental mode has a high overlap with the gain region.

Typically, the first and second parallel mirrors are distributed Bragg reflectors (DBRs), one of which forms an output coupler by allowing a fraction of impinging radiation to be transmitted. The mode-control according to the present invention does not restrict the micro/nano-structuring (MS-region and MC-region) to the output coupling mirror. The light aperture still serves as an aperture for the light since it constitutes an allowed region for the transverse components of the wave-vector of the modes.

The light aperture in a VCSEL according to the present invention may have a three- or more-fold symmetry. Typically, the light aperture will be shaped as a regular polygon, which however is not essential for mode control.

It is an advantage of the invention that the lateral mode-confinement and mode stability is partially decoupled from the current confinement mechanism, which determines the lateral area with high gain. However, the current aperture should be designed to have an optimised overlap with the fundamental mode. The current confinement and optical confinement in prior art VCSELs is typically achieved by selective oxidation of a high Al content AlGaAs layer. The oxide aperture is controlled by the oxidation rate (typically 1 µm/min) and the oxidation ambient, which explains the serious limitations in its reproducibility. Furthermore, the oxide layer has to be carefully designed, since it introduces strain and if not carefully designed it can result in VCSEL reliability problems. Thus, the separation of the optical confinement aperture and current confinement aperture improves device reliability and reproducibility.

The ARROW design has no MS-region, but consists of a light-aperture region and a mode confinement region consisting of one or two ARROW rings with a width of an odd number times the lateral-quarter-wavelength ($\lambda_{\parallel}/4$).

In the present invention the MC-region controls the mode confinement, while the mode selectivity is controlled by mainly the MS-region and partially by the MC-region. The possibility to control the longitudinal reflectivity (photon lifetime) in the MS-region adds an additional design parameter to the VCSEL design, which expands the design space and single fundamental mode (operating regime) stability of a VCSEL for increasing light aperture size significantly.

BRIEF DESCRIPTION OF THE DRAWINGS

FIG. 10 shows a series of measured near-field (top row and third row) and far-field (second row and bottom row) for different currents for the same device as measured in FIG. 9.

DETAILED DESCRIPTION OF THE INVENTION

Figure 1:
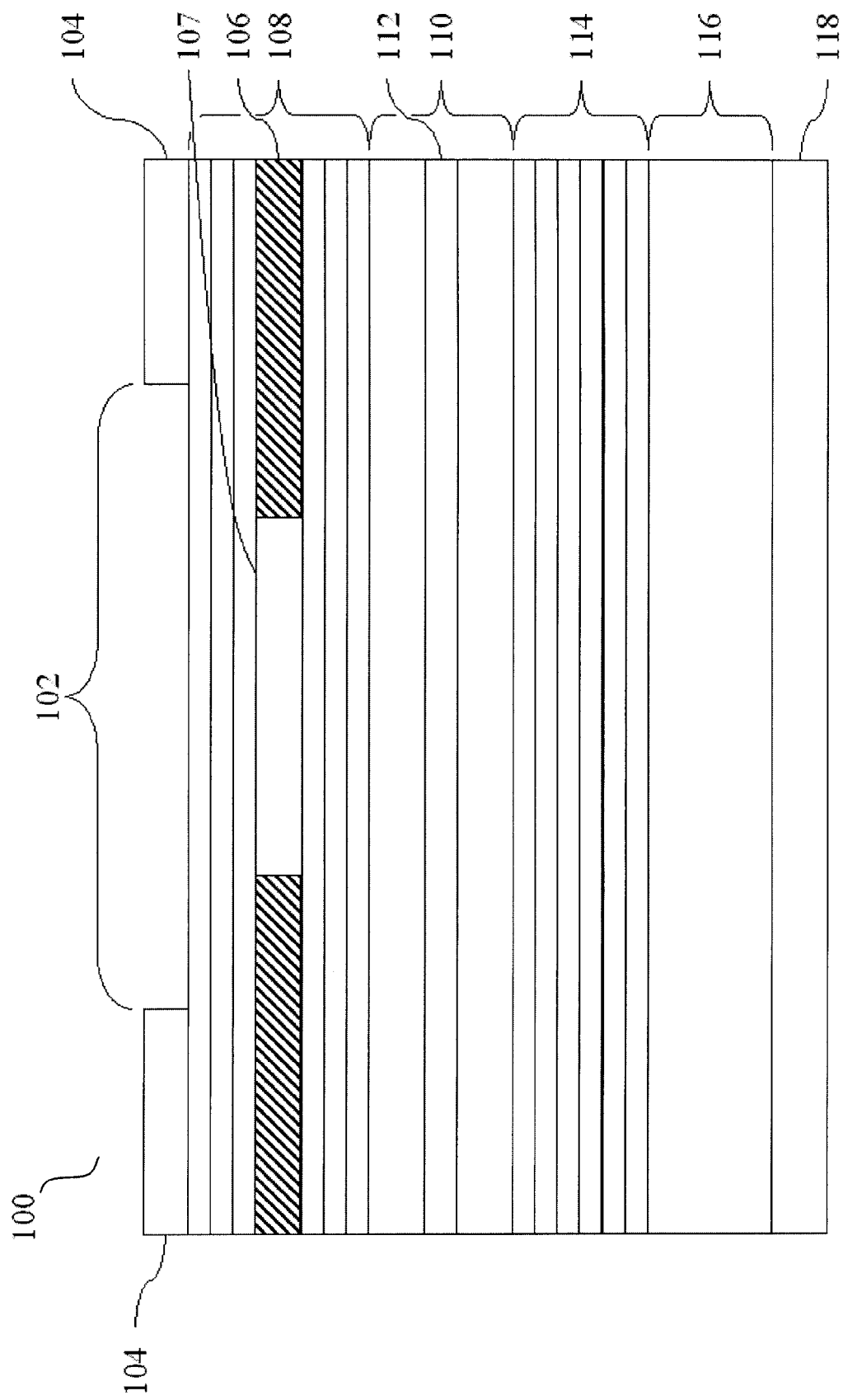
FIG. 1 is a schematic illustration of a standard vertical cavity surface-emitting laser according to the prior art.
Figure 2:
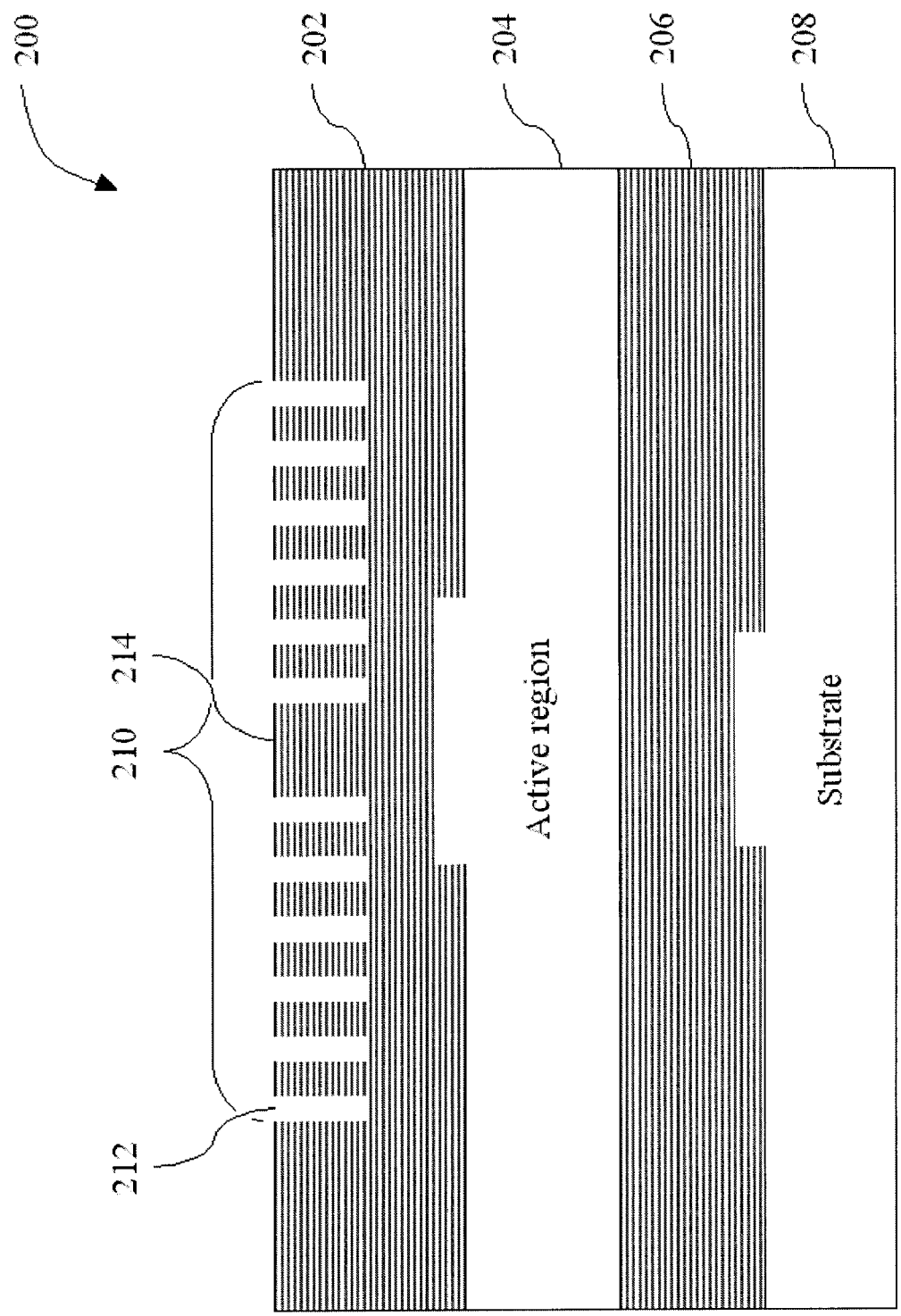
FIG. 2 is a schematic illustration of a vertical-cavity surface-emitting laser according to the prior art, where a micro/nano-structure has been implemented in a complete (standard) VCSEL DBR top mirror.
Figure 3:
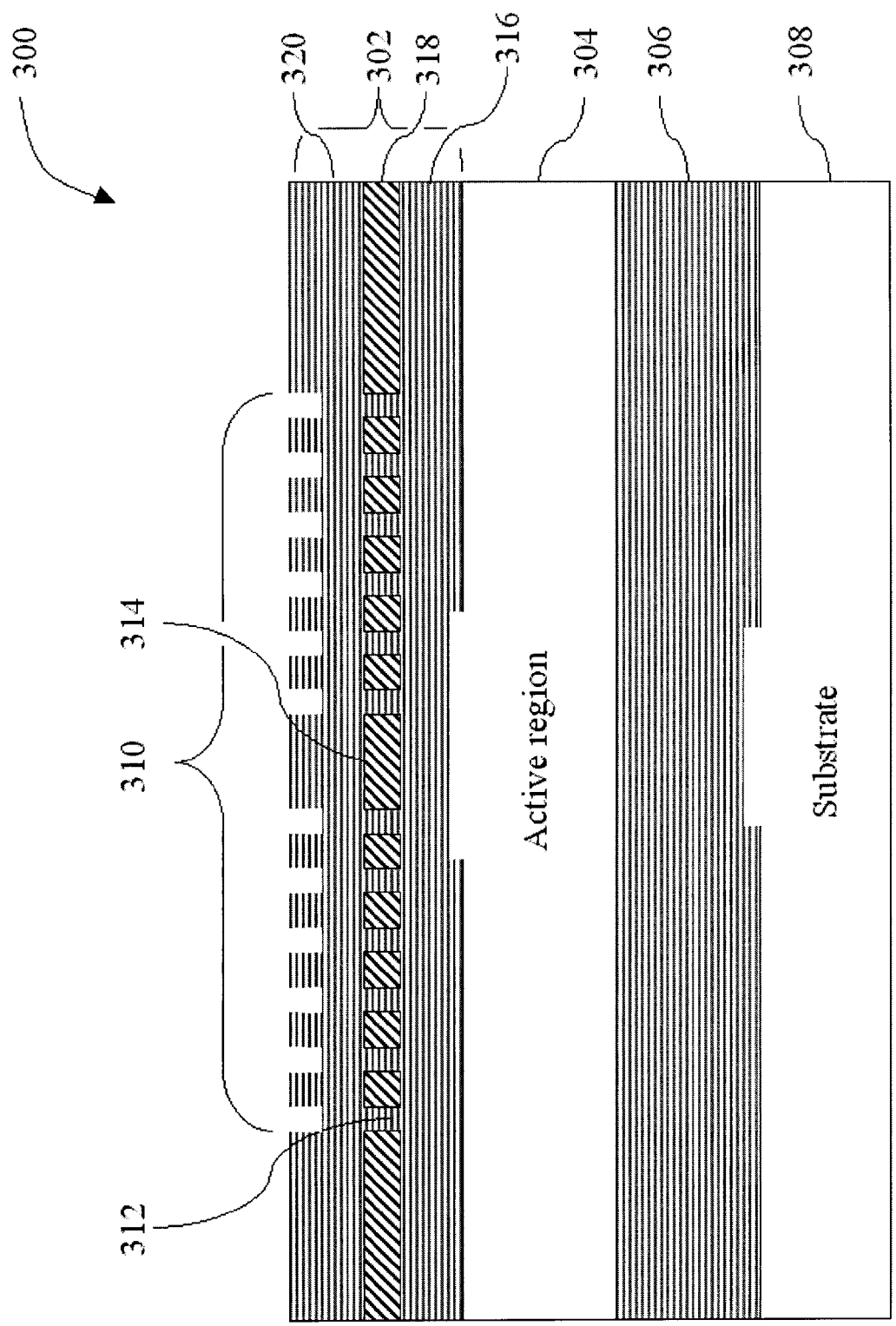
FIG. 3 is a schematic illustration of a vertical-cavity surface-emitting laser according to the prior art, where the micro/nano-structuring has been embedded in the VCSEL DBR top mirror.
Figure 4:
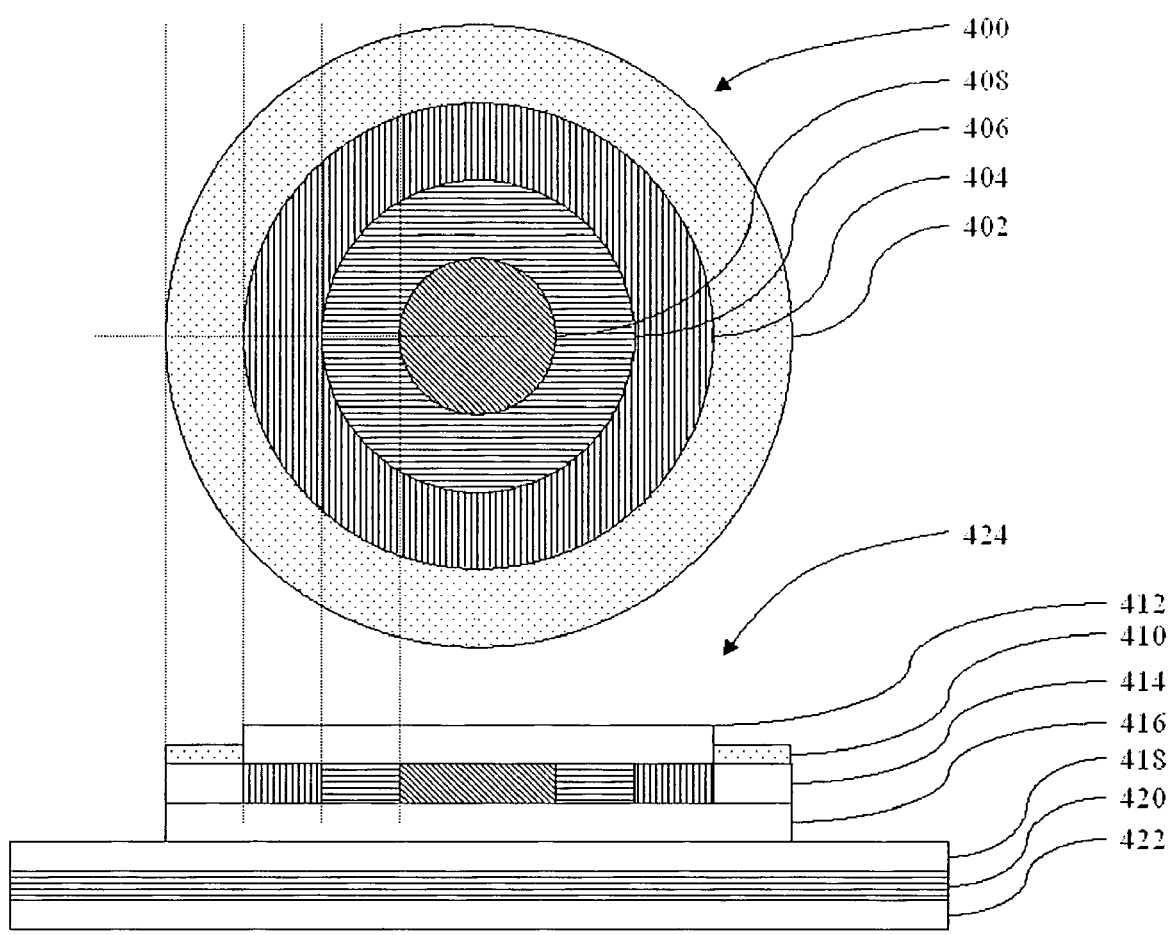
FIG. 4 is a schematic illustration of a top-view region 400 and cross sectional view region 424 of a VCSEL according to the present invention showing the light-aperture region (LA-region) 408, Mode-Shaping region (MS-region) 406, and the Mode-Confinement region (MC-region) 404.

FIG. 4 illustrates the top-view 400 and cross sectional view 424 of a micro/nano-structured vertical cavity surface emitting laser. The electrical contact region 402 on the top-view and region 410 in the cross-sectional view surround the mode confinement region (MC-region) 404, Mode Shaping region (MS-region) 406 and the Light aperture region (LA-region) 408. The LA-region, MS-region and MC-region are also indicated by the hatched areas layers 414 of the cross-sectional view 424. However, the different thickness and the applied micro/nano-structuring is not indicated on this figure. Below layers 414 we have a partial semiconductor DBR top mirror or spacer layer 416. Above layers 414 the top mirror is completed by regrowth of a semiconductor DBR top mirror or dielectric top mirror 412. The FIG. 424 also shows the active layer 418, DBR bottom mirror layers 420 and the substrate 422.

The MS-region (region 406) has a long cavity resonance wavelength compared to the cavity resonance wavelength of region 408 and 404. The MS-region is surrounded by areas with shorter cavity resonance wavelengths and is accordingly a ring shaped guide structure. The confinement mechanism of the modes confined to the MS-region is accordingly similar to the mode confinement mechanism in a traditional step index waveguide, e.g. conventional optical fiber. However, the lateral modes confined to the MS-region do not reach lasing threshold, since the MS-region has a short photon-lifetime (low mirror reflectivity) and most important, the width of the MS-region is very narrow, thus that lateral modes confined to the MS-region have high diffraction losses.

The width of the MS-region should be an even number of lateral-quarter-wavelengths. Typically, the width of the MS-region should just be a single lateral-half-wavelength or just a lateral-wavelength, since the diffraction losses in this case still are dominant. The diffraction losses do not any more prevent lasing of modes confined to the second region, when the width of the second region becomes too broad, and instead the longitudinal photon lifetime of the MS-region should be very short to prevent lasing of lateral modes confined to the MS-region. A VCSEL with a very broad MS-region (several lateral-half-wavelengths) will thus typically have characteristics like an anti-guide VCSEL.

Figure 5:
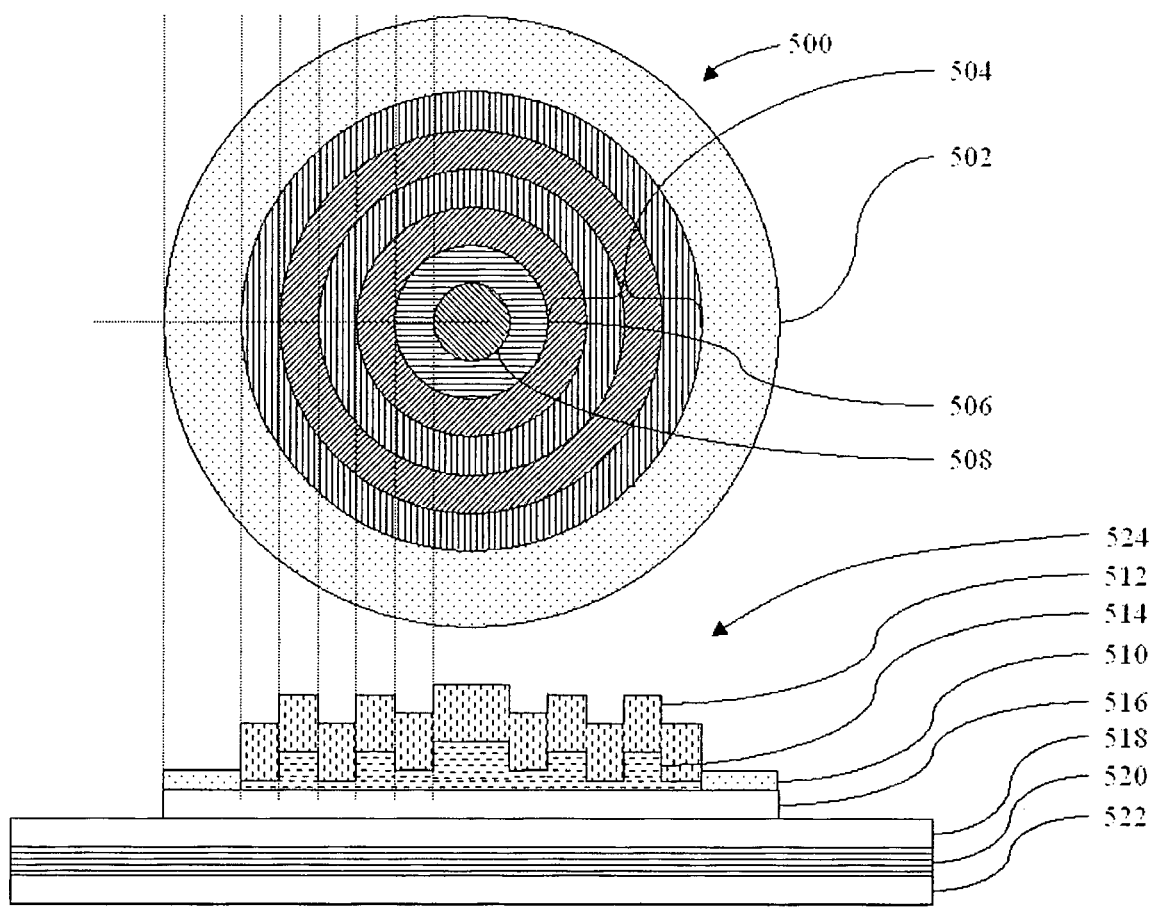
FIG. 5 is an example of the possible top-view region 500 and cross sectional view region 524 of a VCSEL according to the present invention, where a one-dimensional PBG-structure (radial-confinement) 504 and a ring shaped MS-region 506 is used for designing a single fundamental mode VCSEL.

The MC-region (region 404) is a micro/nano-structured region with a rich topology in the cavity resonance wavelength, where preferable all cavity-resonance wavelengths are longer or at least equal to the cavity resonance wavelength of the light aperture region (region 408). A MC-region, where the mode confinement is based on the photonic bandgap effect, results in a strong lateral mode-confinement, since modes penetrating deep into the MC-region are forbidden An example of a possible VCSEL according to the present invention is shown in FIG. 5, where the mode confinement is implemented by a one-dimensional PBG structure region 504 (MC-region). The hatched areas correspond to areas with increased cavity resonance wavelength compared to the light aperture 508. The concentric rings result in a radial band-gap similar to the one-dimensional band-gap of a Bragg-mirror. The concentric rings will thus ensure lateral mode confinement to the MS-region 506 and light aperture region 508.

FIG. 5 illustrates a schematic of the top-view 500 and cross-sectional view 524 of a VCSEL according to the present invention, where the mode confinement is implemented by a one-dimensional-PBG structure. The lateral micro/nano-structure consists of an LA-region 508, a MS-region 506 and a PBG region 504. The cavity resonance wavelength is symbolised by the different shaded areas. The region 508 has the shortest cavity resonance wavelength, while the MS-region (region 506) has a long cavity resonance wavelength. The MC-region (region 504) consists of alternating rings with a short and a long cavity resonance wavelength, region 505 and 507). The short cavity resonance wavelength of region 504 should be longer or at least equal to the cavity resonance wavelength of region 508, while the long cavity resonance wavelength of region 504 can be shorter than or equal to the cavity resonance wavelength of region 508.

The cross-sectional view 524 of the VCSEL shows how the LA-aperture, MS-region and MC-region are implemented in the region 514 of the top mirror of the VCSEL by shallow etching or deposition of material. The VCSEL DBR top-mirror is completed by re-growth of a semiconductor top-mirror or deposition of a dielectric top-mirror 512. Below the micro-structured area we have a spacer or partial semiconductor top mirror region 516. Further more the cross-sectional view 524 shows the active layer 518, bottom DBR mirror 520 and the substrate 522. The electrical contacts are indicated by regions 502 and 516.

Figure 6:
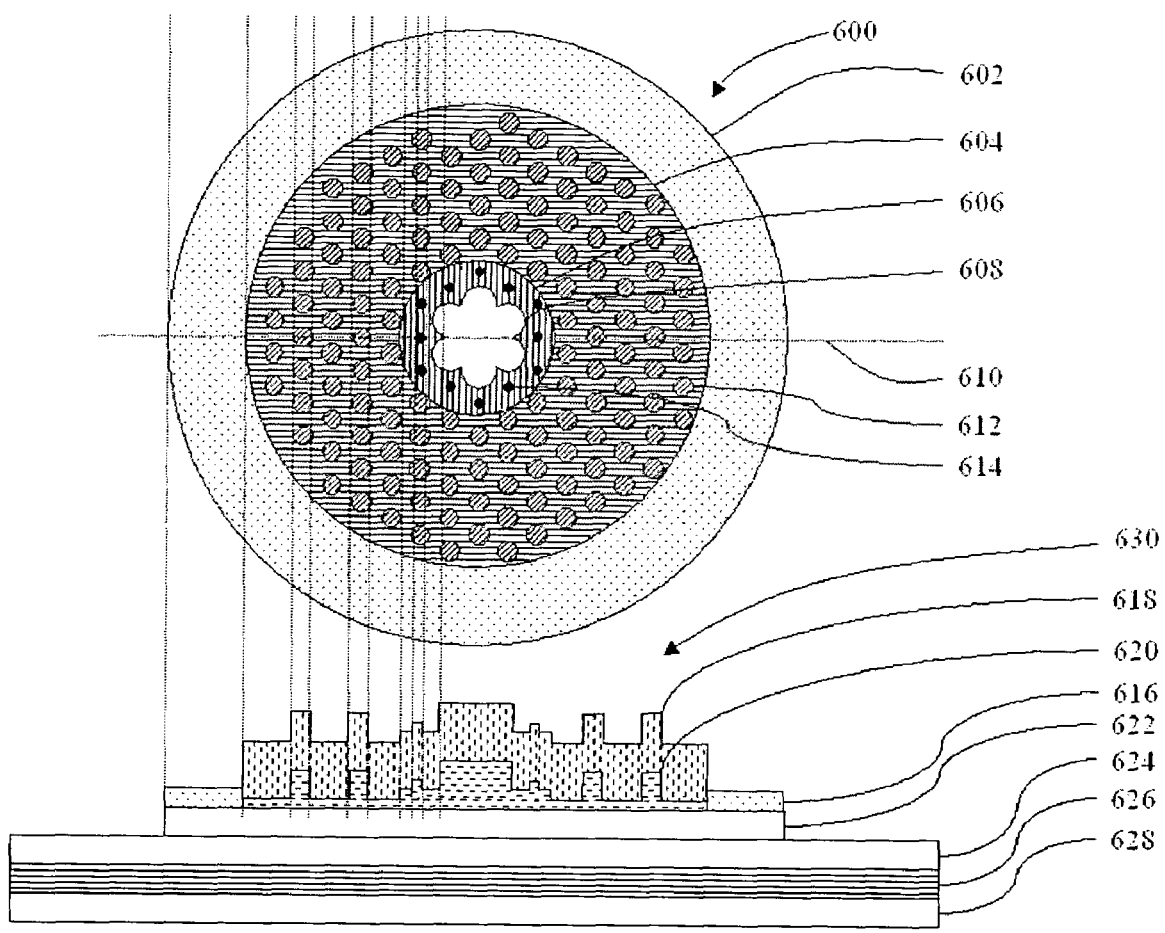
FIG. 6 is an example of the possible top-view region 600 and a cross sectional view region 630 of a VCSEL according to the present invention, where a two-dimensional PBG-structure 604 is used for lateral mode confinement.

FIG. 6 illustrates an example of the top view 600 and cross-sectional view 630 of a VCSEL, according to the present invention, where the mode confinement is implemented by a two-dimensional-PBG structure. The lateral micro/nano-structure consists of a LA-region 608, a MS-region 606 and a MC-region 604. The MS-region 606 consists in the shown example of a micro-structured region, where the background has a long cavity resonance wavelength, while the small holes 614 have a shorter cavity resonance wavelength, which still is longer or at least equal to the cavity resonance wavelength of the LA-region 608. The MC-region 604 consists of a tri-diagonal lattice arrangement of rods 612 with a long cavity resonance wavelength. The cavity resonance wavelength in between the rods (the background of region 604) is longer or equal to the cavity resonance wavelength of the LA-region 608.

A cross-sectional view 630 of the VCSEL at the cut-line 610 shows how the LA-aperture, MS-region and MC-region are implemented in the region 620 of the top mirror of the VCSEL by shallow etching or deposition of material. The cavity resonance wavelength depends on the etch-depth (deposited material thickness). Different thicknesses in region 620 thus correspond to different cavity resonance wavelengths and also different cavity photon life-times. The VCSEL DBR top-mirror is completed by re-growth of a semiconductor top-mirror or deposition of a dielectric top-mirror 618. Below the micro-structured area we have a spacer or partial semiconductor top mirror region 622. Furthermore, the cross-sectional view 630 shows the active layer 624, bottom DBR mirror 626 and the substrate 628. The electrical top contacts are indicated by regions 602 and 616.

The two-dimensional-PBG structure is visualised by a tri-diagonal arrangement of holes 612. The mode confinement could also be implemented by a Honeycomb structure or any other periodic structure resulting in a two-dimensional-PBG.

Figure 7A:
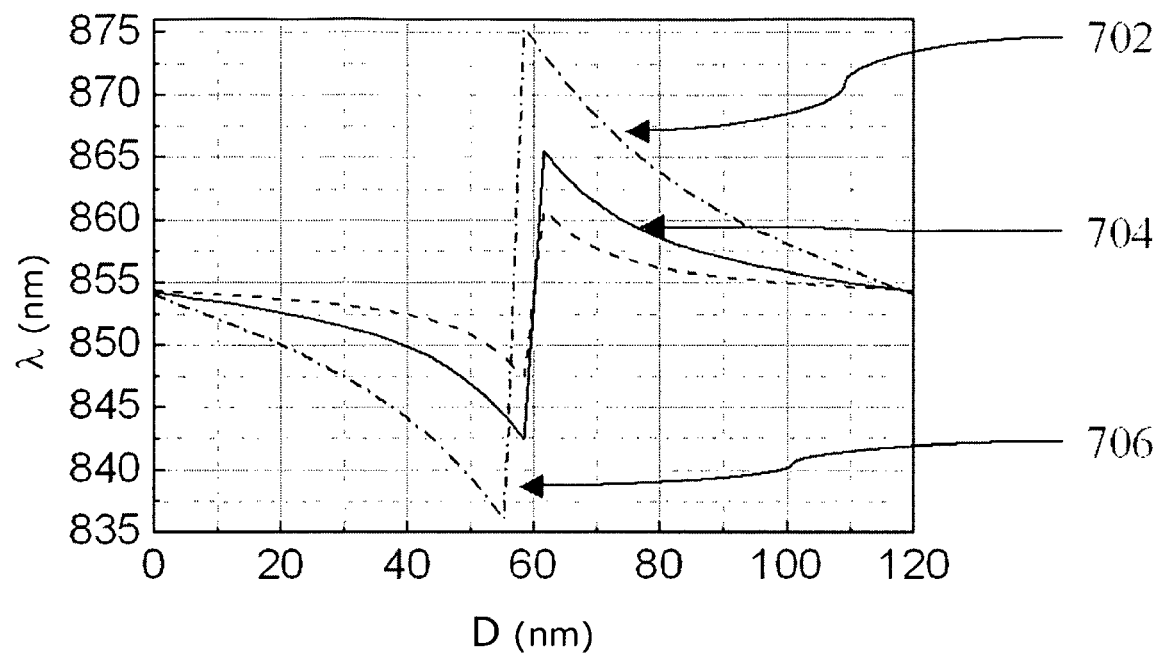
FIGS. 7A and 7B shows the calculated cavity resonance wavelength and photon-lifetime when embedding the micro/nano-structuring within the VCSEL DBR top-mirror.
Figure 7B:
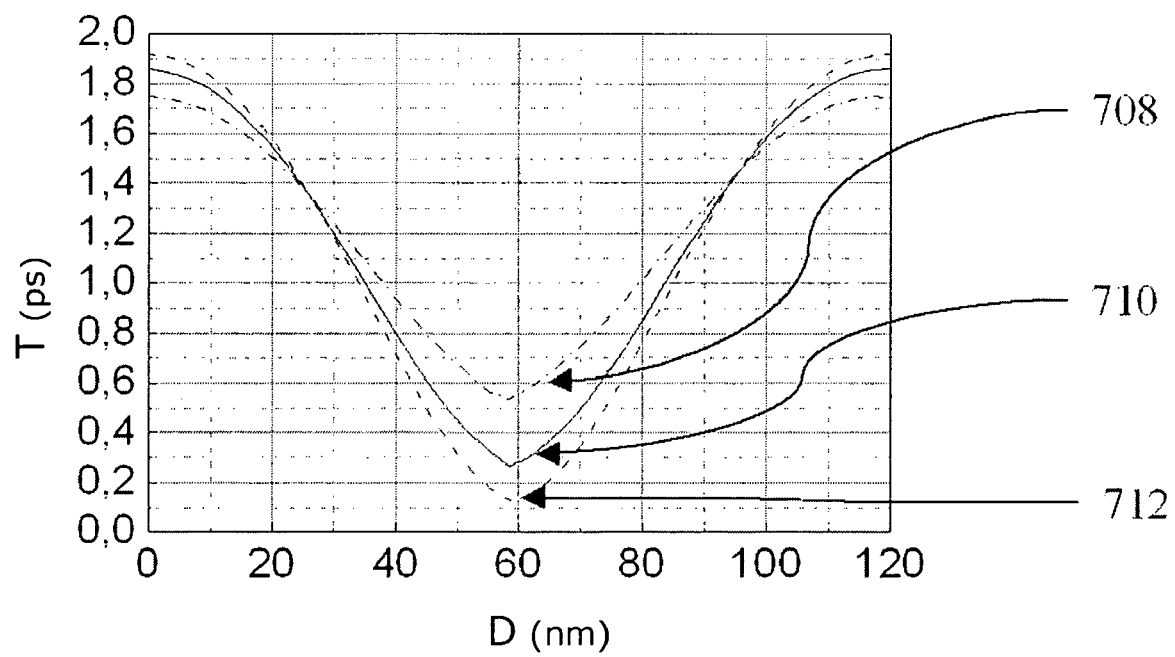

FIG. 7 shows the calculated cavity resonance wavelength, $\lambda$, (702, 704, 706) and the calculated photon life-time, T, (708, 710, 712) as function of etch depth, D, in a semiconductor partial DBR mirrors. The cavity resonance wavelength and photon life-time is plotted for the case where a dielectric DBR top-mirror has been deposited after the etching of the partial DBR semiconductor top mirror. The different curves are for the cases of semiconductor and dielectric top-mirror pairs of 5 and 4 periods (702, 708), 8 and 3 periods (704, 710) and 11 and 2 periods (706, 712), respectively. The maximum cavity resonance wavelength shift for shallow etches is observed for few periods in the semiconductor top-mirror, i.e. when the etch is performed closer to the active region; while the maximum photon life-time change is decreasing for a reduced number of DBR semiconductor top-mirror layers.

The DBR top-mirror deposited after the etch can be done by regrowth of a semiconductor DBR mirror or by deposition of a dielectric DBR top mirror. The dielectric DBR top mirror can be made by using for example alternating layers of $SiO_2$/$TiO_2$, $CaF_2$/ZnSe, $MgF_2$/ZnSe.

Figure 8A:
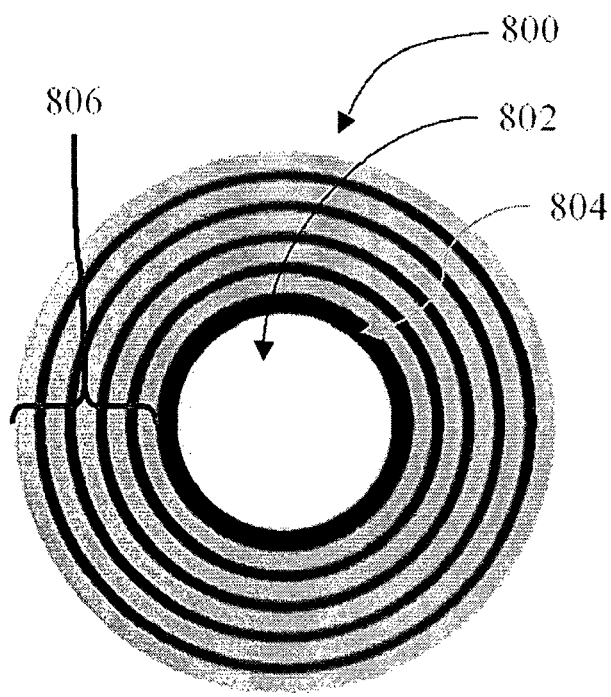
FIG. 8A is an example of the possible top-view of a vertical-cavity surface-emitting laser, where a one-dimensional PBG-structure 806 (radial-confinement) and a ring shaped MS-region 804 defines the lateral mode. The fundamental and first order modes are shown in FIG. 8B and FIG. 8C, respectively.
Figure 8B:
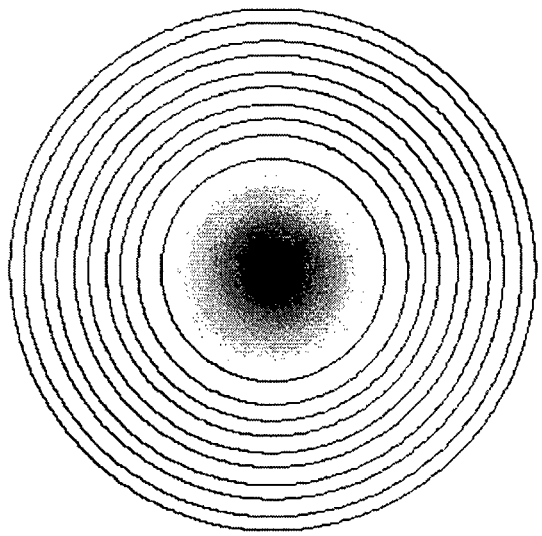
Figure 8C:
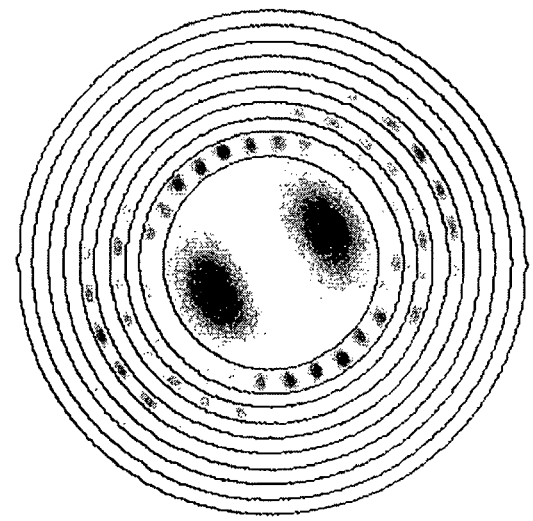

FIG. 8A shows an example of a VCSEL 800 with a one-dimensional PBG structure (region 806), which consists of a Light aperture region 802, a mode shaping region 804 and a MC-region 806, similar to the sketched top view of the one-dimensional PBG structure in FIG. 5. The VCSEL structure supports both the fundamental mode FIG. 8B and the first order mode FIG. 8C. The fundamental mode is well localised to the LA-region, while the first order mode is leaking into the MS-region and the MC-region.

The fundamental mode has a very good overlap with the light aperture region 802, while the first order mode confined by the PBG effect (MC-region 806) has a relatively large overlap with the MS-region 804 and actually also slightly penetrates into the MC-region 806. The first order mode and higher order modes will thus not reach lasing threshold, because of the short longitudinal photon-lifetime of the MS-region 804 and high diffraction losses. The fundamental mode will, as a result of its shape, always have a smaller overlap with the MS-region compared to higher order lateral modes and significantly lower diffraction losses.

The advantage of the present invention compared to prior art solutions is that the mode confinement mechanism and the mode selection mechanism are separated. The overlap with the MS-region of the different modes is controllable by the MC-region and width of the MS-region. The LA-aperture can thus for the appropriate single fundamental mode VCSEL design be increased to aperture diameters of 8 μm to 16 μm. The single-mode characteristics are mainly limited by the inhomogeneous current injection for large aperture sizes. The current injection profile typically has a doughnut-shaped lateral profile for large current aperture sizes, which prevents single fundamental mode operation when increasing the light aperture size beyond 20 µm. By the decoupling provided by the designs of the present invention, the homogeneity of the current injection profile of the VCSEL can be improved to enable single fundamental mode VCSEL operation for larger LA-apertures.

The lateral gain region, defined for example by an oxide aperture for lateral current confinement, is typically larger than the light aperture region. High power single fundamental lateral mode operation of a VCSEL requires that the lateral overlap with the lateral gain distribution is high. The oxide aperture is typically overlapping with the MS-region or the MC-region. A good fundamental mode overlap with the material gain requires a relatively large fundamental mode. This is maintained by the MS-region, which does not contribute to the lateral mode confinement to the light aperture region. Another method to control the fundamental mode size is to tune the lateral mode confinement strength of the MC-region. This can for example in the one-dimensional PBG ring structure be implemented by increasing the lateral ring width of the short/long cavity resonance wavelength areas in the MC-region by 5, 10, 20 or 30%. The ring width is in this case slightly broader than the intended lateral-quarter-wavelength. A third possibility is to decrease the MS-region by 5 or 10%, which also has the tendency to broaden the fundamental mode slightly.

As mentioned previously, the MC-region may be designed in such a way that only the fundamental mode is well confined while higher order lateral modes are very weakly bound and may penetrate relatively deep into both the MS and also the MC-region, which further improves the lateral mode selectivity of the proposed VCSEL. The optimisation of the MC-region for single mode operation is best understood by making an analogy to a DBR Bragg mirror. The high reflectivity window of a DBR mirror can be shifted by increasing or decreasing the layer thickness within the DBR mirror. The same applies for the MC-region (one-dimensional-PBG). The fundamental mode should be placed close to the boarder of the "high reflectivity" window. The fundamental mode will in this case still be well confined by the one-dimensional-PBG region, while higher order modes will be significantly less confined and will penetrate significantly into the MC-region as shown in FIG. 8.

The tuning of the ring width within the MC-region (tuning the PBG-strength) is in simulations also found to be an efficient method to compensate for the thermal lens resulting from heating of the device as the applied current increases. The ring width is adjusted to pre-compensate for the radial dependence of the cavity resonance wavelength shift as the device temperature increases as a result of increasing current flow.

The PBG effect itself is a very efficient method for polarisation control in a VCSEL as claimed in application WO 02/073753. The polarisation selectivity can be combined with the present invention. The principle of polarisation control has so far been implemented by methods based on diffraction losses by having non circular light aperture regions (square, elliptical etc.) or asymmetric current injection. These methods work well for small light aperture regions, but are not suitable for large light aperture VCSELs. Alternative approaches have used highly birefringent materials for VCSEL growth resulting in single polarisation VCSELs. Single polarization VCSELs can also be made by using quantum dots as the active gain material. Typically the quantum dot shape is elongated in one direction resulting in anisotropic gain for the two orthogonal polarization states and thus single polarisation operation of the VCSEL. Here we propose another method for implementing polarization control in a VCSEL according to the present invention by using the PBG effect for polarization control.

The polarization control is implemented by a variation (modifications for the PBG structure) in certain regions of the micro/nano-structured MC-region. The local variation breaks the symmetry of the PBG structure and thus the symmetry of the PBG confinement, which lifts the degeneracy of the two orthogonal polarization modes. In the case of a two-dimensional MC-region as shown in FIG. 6, the tri-diagonal lattice arrangement of rods/holes (region 604, FIG. 6) of long/short cavity resonance wavelength regions in the MC-region has a 60 degrees rotational symmetry and results thus in a lifting of the mode degeneracy of the two orthogonal polarization states. The lifting of the mode degeneracy can be enhanced by changing the pitch (periodicity) of the rod/hole arrangement in certain areas and/or changing the shape and/or area of the rods/holes (region 604 in FIG. 6) in certain areas/directions of the structure.

The lateral mode confinement of the MC-region depends on the polarization state of the lateral mode, which explains why the PBG effect is an efficient method for implementing polarization control in a VCSEL. The principle is basically similar to VCSELs, where the polarization control is resulting from diffraction losses by having for example an elliptical surface relief. In the present invention, the mode selectivity is achieved by having slightly different lateral mode confinement for the two orthogonal polarizations. The overlap of the lateral modes with the MS-region depends in this case on the polarization and the polarization selectivity is resulting from the different loss these modes experience (low photon lifetime in the MS-region).

The design of single mode polarization devices is not restricted to the two-dimensional PBG micro/nano structures. The polarization selectivity can for example be implemented in the one-dimensional design sketched in FIG. 5 by using elliptically shaped rings in the MC-region (region 504, FIG. 5). The width of the individual elliptical rings in the MC-region is still close to an even number of lateral-quarter-wavelengths. However, the width of the rings in the direction of the small and large axis of the ellipse is typically modified by plus or minus 0-30% of a lateral-quarter-wavelength. Typically, the change of the ring width of the large and small axis of the ellipse is in the range of ±0-10% or ±0-20% for good polarisation discrimination.

The shape of the LA-region and MS-region (circular, ellipse, square etc.) is of less importance, since it is the mode confinement mechanisms for the orthogonal polarisations, which determines the mode selection mechanism. However, single polarisation mode VCSEL designs based on the PBG-effect can for enhanced polarisation stability be combined with other methods for polarisation control.

Figure 9A:
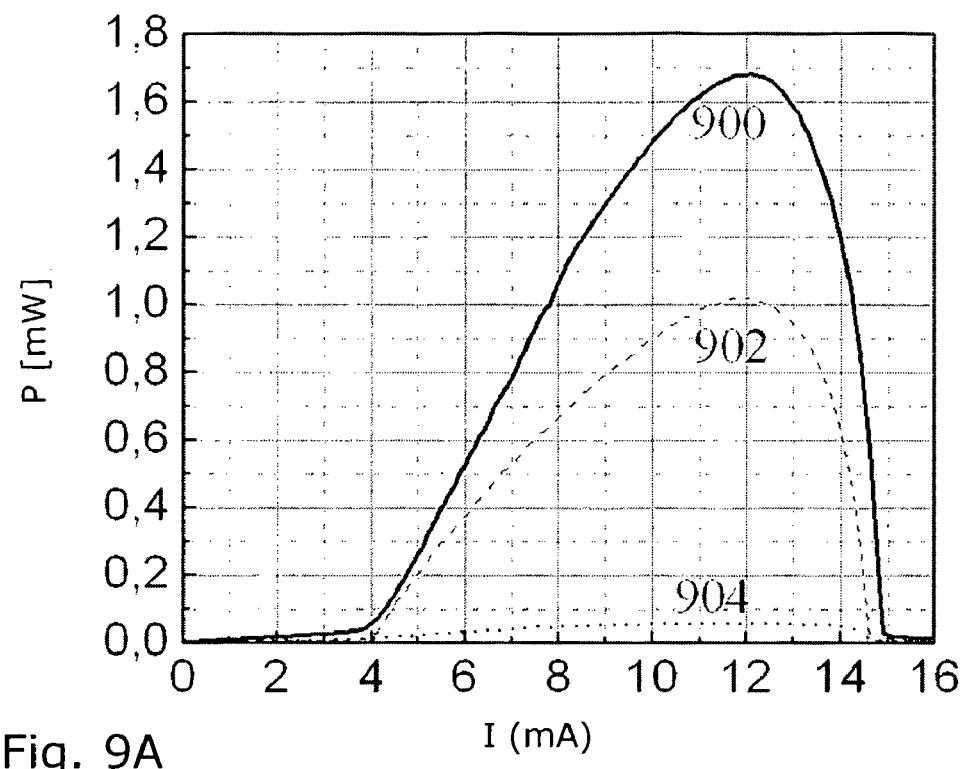
FIG. 9 shows optical output power as function of current and optical spectra for a single mode vertical-cavity surface-emitting laser, having an 8 µm diameter LA-region, an MS-region, and a PBG region to ensure single mode operation.
Figure 9B:
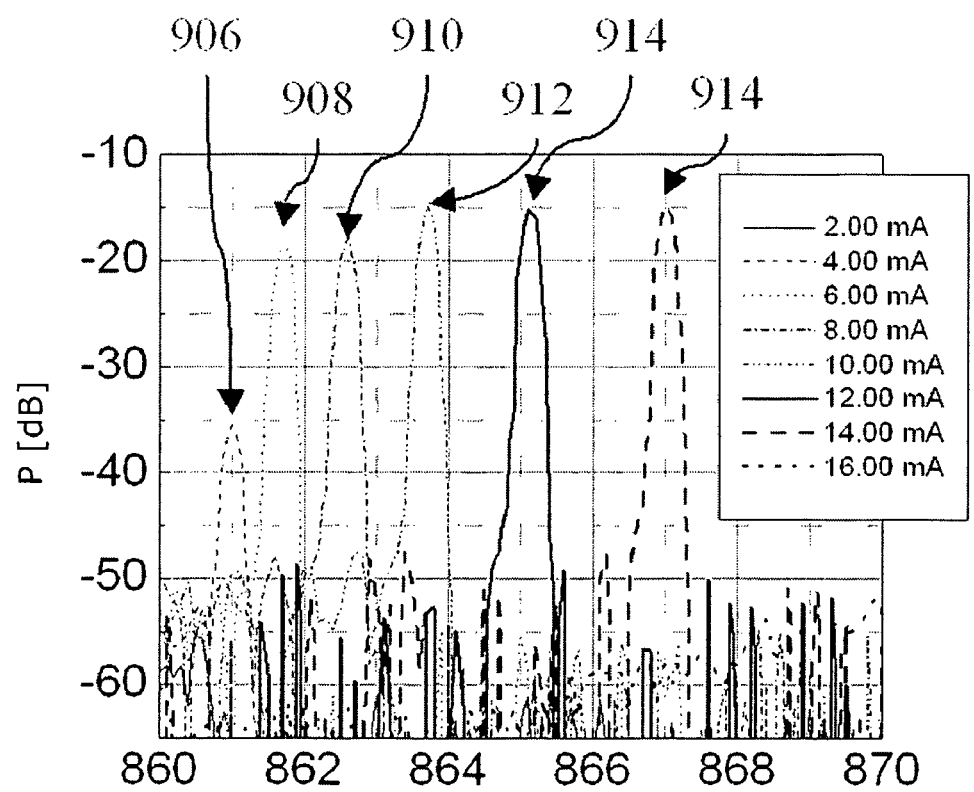

FIG. 9 shows an example of a measured light-current-curve (LI-curve) and measured spectra for different current values for a vertical cavity surface emitting laser with a LA-region diameter of 8 µm. The MS-region and MC-region where designed in accordance with the present invention. Graph 900 is a plot of the total light output power. Graph 902 and 904 are the polarisation resolved output power for the two orthogonal polarizations. The polarization cube introduced some unwanted additional optical loss. The optical spectra are shown for different current values: 4 mA 906, 6 mA 908, 8 mA 910, 10 mA 912, 12 mA 914 and 14 mA 916. The optical spectra show nice single mode operation of the VCSEL with a Side Mode Suppression Ratio (SMSR) of more than 25 dB. The minimum SMSR can not be determined, since it is buried in the noise level of the signal.

The VCSEL operates in a single polarization state, even though we did not optimize the VCSEL for a single polarization state. The spectra show excellent lateral mode control resulting from the MS and MC-region. The oxide aperture had a diameter of 10-11 µm and was thus significantly larger than the LA-aperture. Reference VCSEL where the lateral mode confinement resulted from the oxide aperture showed lasing of multiple higher order modes. As well as 8 µm diameter antiguide VCSELs also showed lasing of higher order modes. Both reference structures were on the same die as the VCSEL according to our invention. Furthermore, both orthogonal polarization states were lasing in these reference VCSELs.

FIG. 10 shows measured examples of the near-field (upper row) and far-field (lower row) of the vertical cavity surface emitting laser, which LI-curve and spectra are plotted in FIG. 9. Single fundamental mode operation is observed for all current values for both the measured near and far-fields. Furthermore, the Full Width Half maximum (FWHM) divergence angle of the far-field is only 7 degrees, which is expected for an 8 µm LA-region VCSEL. The far-field measurements confirm the fundamental mode lasing of the VCSEL according to our invention.

The invention claimed is:

1. A vertical cavity surface emitting laser (VCSEL) involving a multi-layer structure comprising different regions defined in one or more layers, the relations between the different regions being determined in a projection along a direction normal to the layers, the VCSEL comprising:
   a semiconductor material layer having an active region for generating light and for emitting the generated light,
   first and second at least substantially parallel mirrors forming a laser cavity comprising the active region, the laser cavity and the active region supporting at least one longitudinal electromagnetic mode for the generated light,
   a central light aperture (LA) region providing a long photon lifetime and overlapping with the active region,
   a mode-shaping (MS) region formed within or adjacent to the first and/or the second mirror and encircling the LA-region, the MS-region providing a shorter photon lifetime than the LA-region,
   a mode confinement (MC) region formed within or adjacent to the first and/or the second mirror and encircling the MS-region, and designed to provide lateral confinement of modes to the MS-region and the LA-region,
   wherein dimensions of the LA-region, the MS-region and the MC-region are selected to engineer an efficiency of laser action in each transverse electromagnetic mode of the cavity and the LA-region is an anti-guide with respect to the MS-region and the MS-region is designed to reduce/minimise lateral confinement of modes to the LA-region.

2. The VCSEL according to claim 1, wherein the LA region and the MS region are not formed in contact with the active region.

3. The VCSEL according to claim 1, wherein the LA region and the MS region are not formed in layers adjacent to the active region.

4. The VCSEL according to claim 1, wherein the MS-region is formed by a vertical structuring providing a longer longitudinal cavity resonance wavelength than a longitudinal cavity resonance wavelength of the LA-region.

5. The VCSEL according to claim 1, wherein a structure of the MS-region has a periodicity which does not provide a reflection of lateral wavelengths at a boundary between the MS-region and the LA-region.

6. The VCSEL according to claim 1, wherein dimensions of the MS-region and the MC-region in said direction are significantly smaller than an overall dimension of the VCSEL in said direction.

7. The VCSEL according to claim 1, further comprising means for confining an injected current to the LA-region and the MS-region, said means for confining an injected current comprising proton implantation in regions of the multi-layer structure surrounding the MS-region.

8. The VCSEL according to claim 1, further comprising means for confining an injected current to the LA-region and the MS-region, said means for confining an injected current comprising selective oxidation of single or multiple layers of the multi-layer structure surrounding the LA-region.

9. The VCSEL according to claim 1, wherein the MC-region comprises a one-dimensional PBG structure.

10. The semiconductor laser of claim 1 wherein the MC-region consist of one or more vertically structured rings having widths being an odd number of lateral-quarter-wavelengths increased or decreased by a 0-5% or 0-10% or 0-15% or 0-20% or 0-25% or 0-30%.

11. The semiconductor laser of claim 1 wherein the MC-region consist of elliptical, rectangular or non-symmetric vertically structured rings having a width being an odd number of lateral-quarter-wavelengths increased or decreased by 0 to 30%.

12. The VCSEL according to claim 1 wherein the MC-region comprises a two-dimensional PBG structure.

13. The VCSEL according to claim 12, wherein periodicity or dimensions of the two-dimensional PBG structure is modified in selected regions to obtain polarization control.

14. The VCSEL according to claim 1, wherein the MS-region is a micro/nanostructured region, which minimizes the lateral reflection of this region with respect to the LA-region.

15. The semiconductor laser of claim 1 wherein the MS-region consist of an elliptical, rectangular or non-centre-symmetric, vertically structured ring having a width being an odd number of lateral-half-wavelengths increased or decreased by 0 to 30%.

16. The VCSEL according to claim 1, wherein the LA-region, the MS-region and the MC-region are implemented in a partial semiconductor DBR top mirror.

17. The VCSEL according to claim 1, wherein the LA-region, the MS-region and the MC-region are implemented in dielectric top-mirror layers.

18. A vertical cavity surface emitting laser (VCSEL) involving a multi-layer structure comprising different regions defined in one or more layers, the relations between the different regions being determined in a projection along a direction normal to the layers, the VCSEL comprising:
   a semiconductor material layer having an active region for generating light and for emitting the generated light,
   first and second at least substantially parallel mirrors forming a laser cavity comprising the active region, the laser cavity and the active region supporting at least one longitudinal electromagnetic mode for the generated light,
   a central light aperture (LA) region providing a long photon lifetime and overlapping with the active region,
   a mode-shaping (MS) region formed within or adjacent to the first and/or the second mirror and encircling the LA-region, the MS-region providing a shorter photon lifetime than the LA-region,
   a mode confinement (MC) region formed within or adjacent to the first and/or the second mirror and encircling the MS-region, and designed to provide lateral confinement of modes to the MS-region and the LA-region, wherein dimensions of the LA-region, the MS-region and the MC-region are selected to engineer an efficiency of laser action in each transverse electromagnetic mode of the cavity and the MS-region is a vertically structured or doped ring having a width being an even number of lateral-quarter-wavelengths increased or decreased by a 0-5% or 0-10% or 0-15% or 0-20% or 0-25% or 0-30%.

19. The VCSEL according to claim 18, wherein the MS-region is a micro/nanostructured region, which minimizes the lateral reflection of this region with respect to the LA-region.

20. The semiconductor laser of claim 18, wherein the MS-region consist of an elliptical, rectangular or non-centre-symmetric, vertically structured ring having a width being an odd number of lateral-half-wavelengths increased or decreased by 0 to 30%.

21. The VCSEL according to claim 18, wherein the LA-region, the MS-region and the MC-region are implemented in a partial semiconductor DBR top mirror.

22. The VCSEL according to claim 18, wherein the LA-region, the MS-region and the MC-region are implemented in dielectric top-mirror layers.

23. A vertical cavity surface emitting laser (VCSEL) involving a multi-layer structure comprising different regions defined in one or more layers, the relations between the different regions being determined in a projection along a direction normal to the layers, the VCSEL comprising
   an active region,
   first and second at least substantially parallel mirrors forming a laser cavity comprising the active region,
   a light aperture (LA) region providing a long photon lifetime,
   a mode confinement (MC) region formed adjacent to or within the first and/or second mirror and designed to provide lateral confinement of modes to the LA-region
   wherein a mode shaping (MS) region is formed between the LA-region and the MC-region, the MS-region being formed adjacent to or within the first and/or second mirror and providing a shorter photon lifetime than the LA-region,
   wherein
      the LA-region is an anti-guide with respect to the MS-region and the MS-region is designed to reduce/minimise lateral confinement of modes to the LA-region, and/or
      the MS-region is formed by a vertical structuring providing a longer longitudinal cavity resonance wavelength than a longitudinal cavity resonance wavelength of the LA-region, and/or
      a structure of the MS-region has a periodicity which does not provide a reflection of lateral wavelengths at a boundary between the MS-region and the LA-region.

24. A method for engineering an efficiency of laser action in transverse electromagnetic modes of a vertical cavity surface emitting laser (VCSEL), the method comprising the steps of
   providing a VCSEL comprising an active region, first and second at least substantially parallel mirrors forming a laser cavity comprising the active region, and a central light aperture (LA) region providing a long photon lifetime,
   introducing losses to modes depending upon their lateral profile by forming a mode-shaping (MS) region around the LA-region making the LA-region anti-guiding with respect to the MS-region, the MS-region providing a shorter photon lifetime than the LA-region, and
   laterally confining modes to the MS-region and the LA-region by forming a mode confinement (MC) region around the MS-region.

25. The method according to claim 24, wherein the step of forming the MS-region comprises the step of ensuring leaking of modes from the LA-region to the MS region.

* * * * *